(12) United States Patent
Barber

(10) Patent No.: US 11,546,998 B2
(45) Date of Patent: Jan. 3, 2023

(54) MULTILAYERED TRANSIENT LIQUID PHASE BONDING

(71) Applicant: SKYWORKS SOLUTIONS, INC., Irvine, CA (US)

(72) Inventor: Bradley Paul Barber, Acton, MA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 550 days.

(21) Appl. No.: 16/735,967

(22) Filed: Jan. 7, 2020

(65) Prior Publication Data

US 2020/0146155 A1 May 7, 2020

Related U.S. Application Data

(62) Division of application No. 14/815,098, filed on Jul. 31, 2015, now Pat. No. 10,568,213.

(Continued)

(51) Int. Cl.
*H05K 3/10* (2006.01)
*C23C 28/02* (2006.01)
(Continued)

(52) U.S. Cl.
CPC ........... *H05K 3/10* (2013.01); *B32B 15/01* (2013.01); *C23C 28/021* (2013.01); *C23C 28/023* (2013.01); *H01L 21/321* (2013.01); *H01L 21/50* (2013.01); *H01L 23/10* (2013.01); *H01L 24/27* (2013.01); *H01L 24/29* (2013.01); *H01L 24/83* (2013.01); *H05K 1/11* (2013.01); *H05K 1/18* (2013.01); *H05K 3/3463* (2013.01); *H01L 2224/13083* (2013.01); *H01L 2224/16168* (2013.01); *H01L 2224/16502* (2013.01); *H01L 2224/16503* (2013.01); *H01L 2224/271* (2013.01); *H01L 2224/27416* (2013.01);
(Continued)

(58) Field of Classification Search
None
See application file for complete search history.

(56) References Cited

U.S. PATENT DOCUMENTS 3,439,231 A 4/1969 Bode
4,973,117 A 11/1990 Yamada
(Continued)

FOREIGN PATENT DOCUMENTS

CN 103887404 A 6/2014
DE 102012110542 A1 6/2014
(Continued)

OTHER PUBLICATIONS

Zhou et al., "Au/Sn Solder Alloy and Its Applications in Electronics Packaging", Coining, Inc., Institute of Microelectronics, 1999.

*Primary Examiner* — Evren Seven
(74) *Attorney, Agent, or Firm* — Lando & Anastasi, LLP

(57) ABSTRACT

A bonding structure includes a first layer of first alloy component disposed on a substrate and a first layer of a second alloy component disposed on the first alloy component. The second alloy component has a lower melting temperature than the first alloy component. A second layer of the first alloy component is disposed on the first layer of the second alloy component and a second layer of the second alloy component is disposed on the second layer of the first alloy component.

21 Claims, 18 Drawing Sheets

Related U.S. Application Data

(60) Provisional application No. 62/031,824, filed on Jul. 31, 2014.

(51) Int. Cl.

| | | |
|---|---|---|
| *B32B 15/01* | (2006.01) | |
| *H01L 21/321* | (2006.01) | |
| *H05K 1/11* | (2006.01) | |
| *H05K 1/18* | (2006.01) | |
| *H01L 23/10* | (2006.01) | |
| *H01L 23/00* | (2006.01) | |
| *H05K 3/34* | (2006.01) | |
| *H01L 21/50* | (2006.01) | |

(52) U.S. Cl.
CPC ............. *H01L 2224/27418* (2013.01); *H01L 2224/29309* (2013.01); *H01L 2224/29316* (2013.01); *H01L 2224/29344* (2013.01); *H01L 2224/29347* (2013.01); *H01L 2224/29409* (2013.01); *H01L 2224/29411* (2013.01); *H01L 2224/29424* (2013.01); *H01L 2224/29444* (2013.01); *H01L 2224/29499* (2013.01); *H01L 2224/83191* (2013.01); *H01L 2224/83192* (2013.01); *H01L 2224/83805* (2013.01); *H01L 2224/83825* (2013.01); *H01L 2924/165* (2013.01); *H05K 2201/10053* (2013.01); *H05K 2201/10083* (2013.01); *H05K 2201/10984* (2013.01)

(56) References Cited

U.S. PATENT DOCUMENTS

| | | | |
|---|---|---|---|
| 5,448,014 | A | 9/1995 | Kong et al. |
| 6,578,754 | B1 | 6/2003 | Tung |
| 6,586,831 | B2 | 7/2003 | Gooch et al. |
| 6,884,313 | B2 | 4/2005 | Liu et al. |
| 7,091,650 | B2 | 8/2006 | Xu et al. |
| 7,132,721 | B2 | 11/2006 | Platt et al. |
| 7,421,767 | B2 | 9/2008 | Aoki |
| 7,628,309 | B1 | 12/2009 | Eriksen et al. |
| 7,832,177 | B2 | 11/2010 | Stark |
| 7,936,062 | B2 | 5/2011 | Humpston et al. |
| 8,348,139 | B2 | 1/2013 | Liu et al. |
| 9,768,345 | B2 | 9/2017 | Hu et al. |
| 9,773,750 | B2 * | 9/2017 | Bibl ................ H01L 24/75 |
| 9,847,310 | B2 | 12/2017 | Seddon et al. |
| 9,853,204 | B2 | 12/2017 | Kruger et al. |
| 10,058,951 | B2 | 8/2018 | Yoon et al. |
| 10,196,745 | B2 | 2/2019 | Kapusta et al. |
| 10,374,574 | B2 | 8/2019 | Bulger |
| 10,439,587 | B2 | 10/2019 | Takano |
| 2002/0113296 | A1 | 8/2002 | Cho et al. |
| 2004/0041496 | A1 | 3/2004 | Imai et al. |
| 2004/0087043 | A1 | 5/2004 | Lee et al. |
| 2006/0131998 | A1 | 6/2006 | Aoki et al. |
| 2006/0249847 | A1 | 11/2006 | Eriksen et al. |
| 2007/0058003 | A1 | 3/2007 | Aoki |
| 2007/0069726 | A1 | 3/2007 | Miyoshi |
| 2009/0004500 | A1 * | 1/2009 | Suh ................ B23K 35/001 29/469 |
| 2009/0203163 | A1 | 8/2009 | Eriksen et al. |
| 2010/0244161 | A1 | 9/2010 | Tabrizi |
| 2010/0308697 | A1 | 12/2010 | Aratake et al. |
| 2011/0114355 | A1 | 5/2011 | Bauer et al. |
| 2011/0220704 | A1 | 9/2011 | Liu et al. |
| 2012/0112201 | A1 | 5/2012 | Otsuka et al. |
| 2012/0126669 | A1 | 5/2012 | Kobayashi et al. |
| 2013/0001782 | A1 | 1/2013 | Otsuka et al. |
| 2014/0106649 | A1 | 4/2014 | Kim et al. |
| 2014/0111062 | A1 | 4/2014 | Bauer et al. |
| 2014/0118084 | A1 | 5/2014 | Takemura |
| 2014/0175495 | A1 | 6/2014 | Chuang et al. |
| 2014/0264762 | A1 | 9/2014 | Rajoo et al. |
| 2014/0339957 | A1 | 11/2014 | Tajima et al. |
| 2015/0008253 | A1 | 1/2015 | Yoon et al. |
| 2015/0102510 | A1 | 4/2015 | Kaneda et al. |
| 2015/0123744 | A1 | 5/2015 | Nishimura et al. |
| 2016/0037649 | A1 | 2/2016 | Barber |
| 2016/0079303 | A1 | 3/2016 | Takyu et al. |
| 2016/0365843 | A1 | 12/2016 | Martin et al. |
| 2017/0086320 | A1 | 3/2017 | Barber |
| 2017/0232562 | A1 | 8/2017 | Maeno |
| 2017/0290160 | A1 | 10/2017 | Takano et al. |
| 2018/0158801 | A1 | 6/2018 | Takano |
| 2018/0159502 | A1 | 6/2018 | Takano |
| 2018/0159503 | A1 | 6/2018 | Takano |
| 2019/0393850 | A1 | 12/2019 | Yong et al. |
| 2020/0021269 | A1 | 1/2020 | Takano |
| 2020/0090951 | A1 | 3/2020 | Barber |
| 2020/0127633 | A1 | 4/2020 | Takano et al. |

FOREIGN PATENT DOCUMENTS

| | | |
|---|---|---|
| JP | H10-50638 A | 2/1998 |
| JP | 2002289768 A | 10/2002 |
| JP | 2004095849 A | 3/2004 |
| JP | 2004194290 A | 7/2004 |
| JP | 2006135264 A | 5/2006 |
| JP | 2006246112 A | 9/2006 |
| JP | 2006345170 A | 12/2006 |
| JP | 2007082867 A | 4/2007 |
| JP | 2007266294 A | 10/2007 |
| JP | 2007536105 A | 12/2007 |
| JP | 2008252351 A | 10/2008 |
| JP | 2009525613 A | 7/2009 |
| JP | 2009177736 A | 8/2009 |
| JP | 2009200093 A | 9/2009 |
| JP | 2011223234 A | 11/2011 |
| JP | 2012074612 A | 4/2012 |
| JP | 2013055632 A | 3/2013 |
| JP | 2013093472 A | 5/2013 |
| JP | 2013172435 A | 9/2013 |
| JP | 2014199852 A | 10/2014 |
| JP | 2015024443 A | 2/2015 |
| JP | 2015091065 A | 5/2015 |
| JP | 2016066787 A | 4/2016 |
| JP | 2016096265 A | 5/2016 |
| WO | 2010050061 A1 | 1/2010 |
| WO | 2010021267 A1 | 2/2010 |
| WO | 2011013553 A1 | 2/2011 |

\* cited by examiner

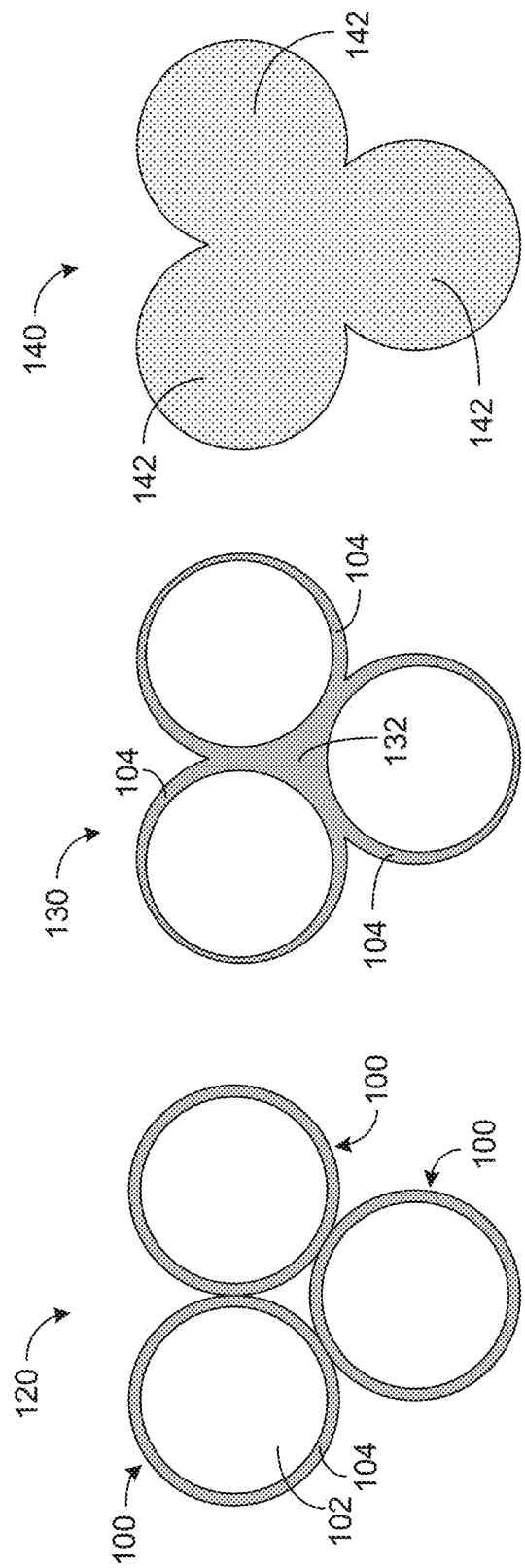

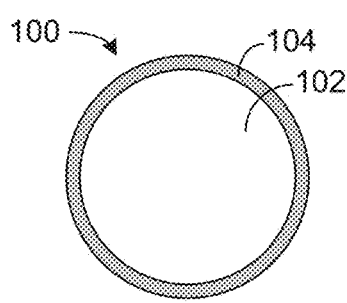 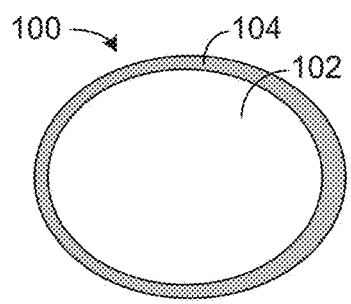 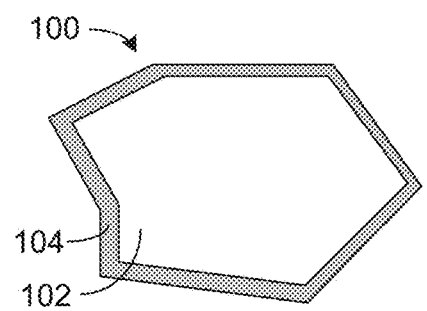
FIG. 9A  FIG. 9B  FIG. 9C
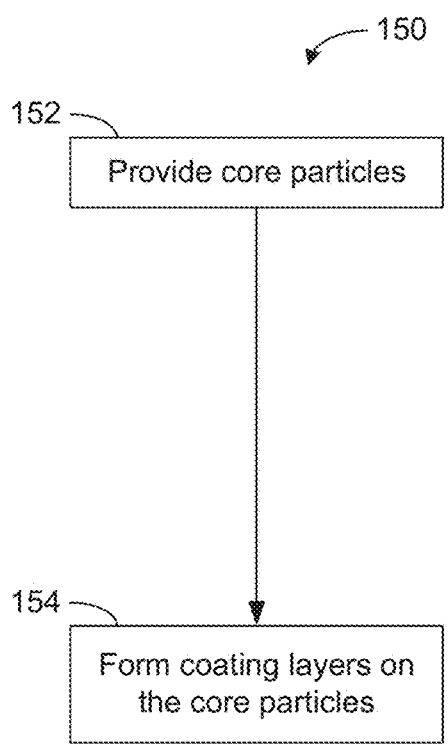
FIG. 10
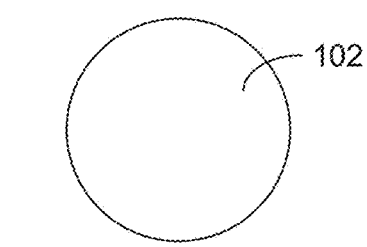
FIG. 11A
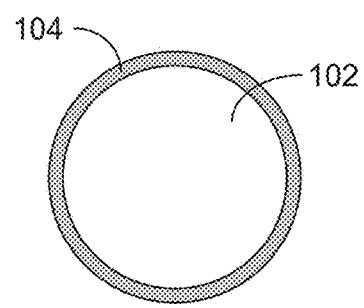
FIG. 11B

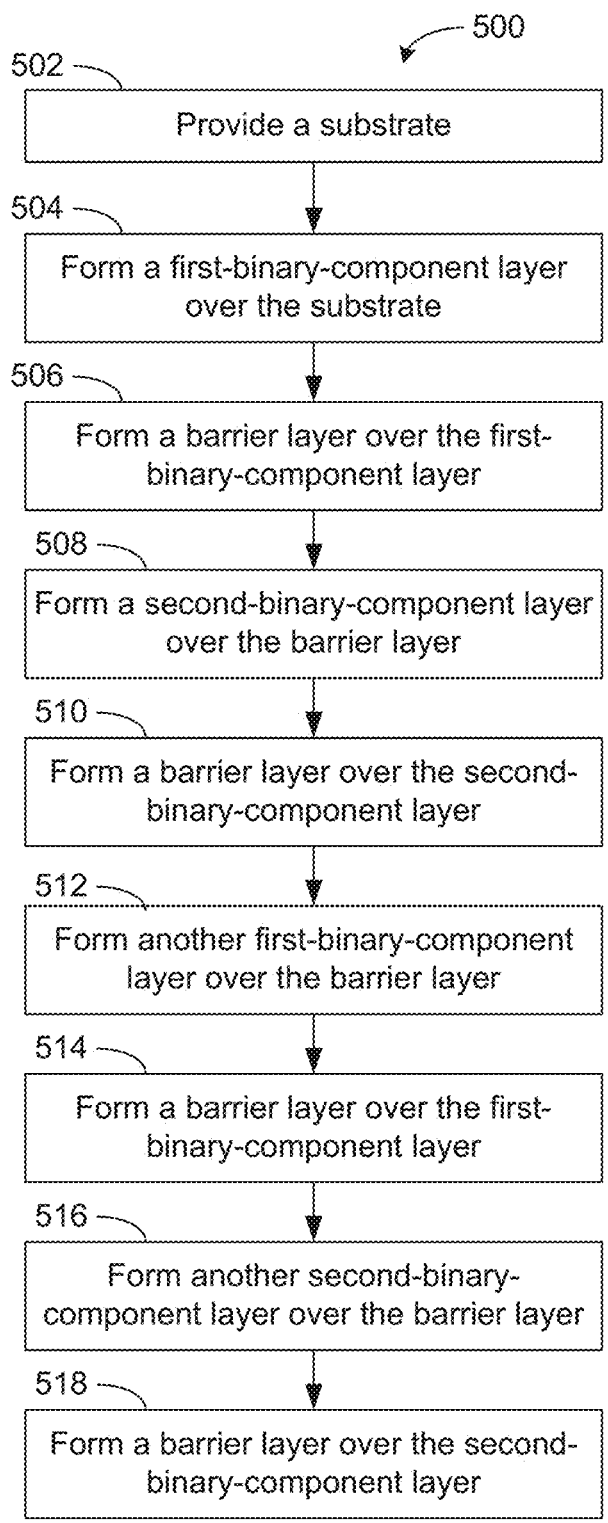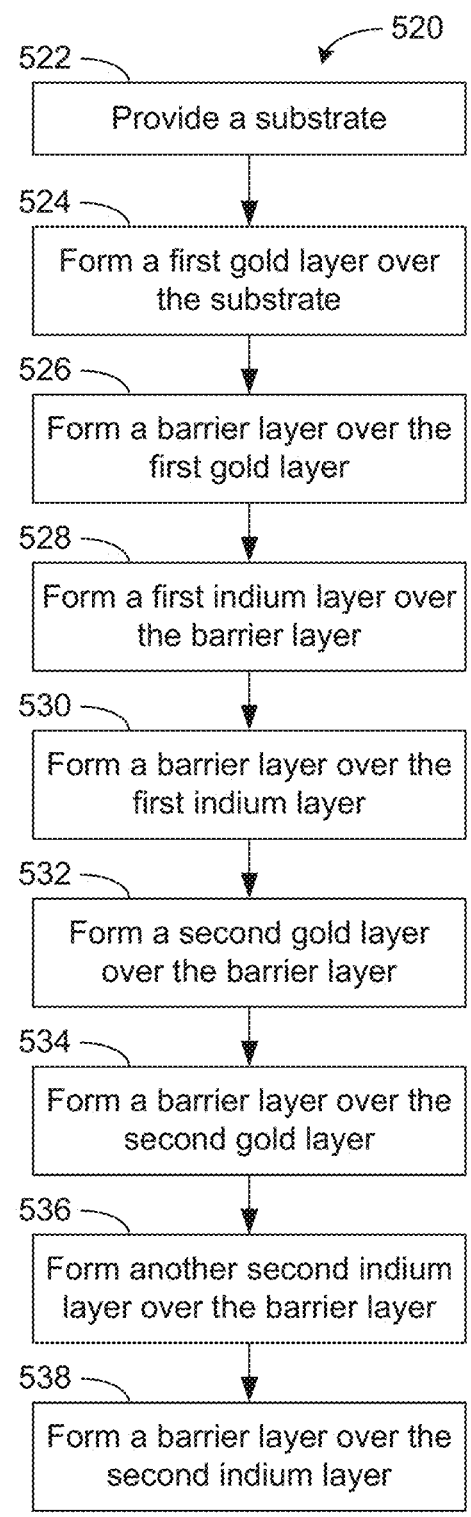
FIG. 28
FIG. 29

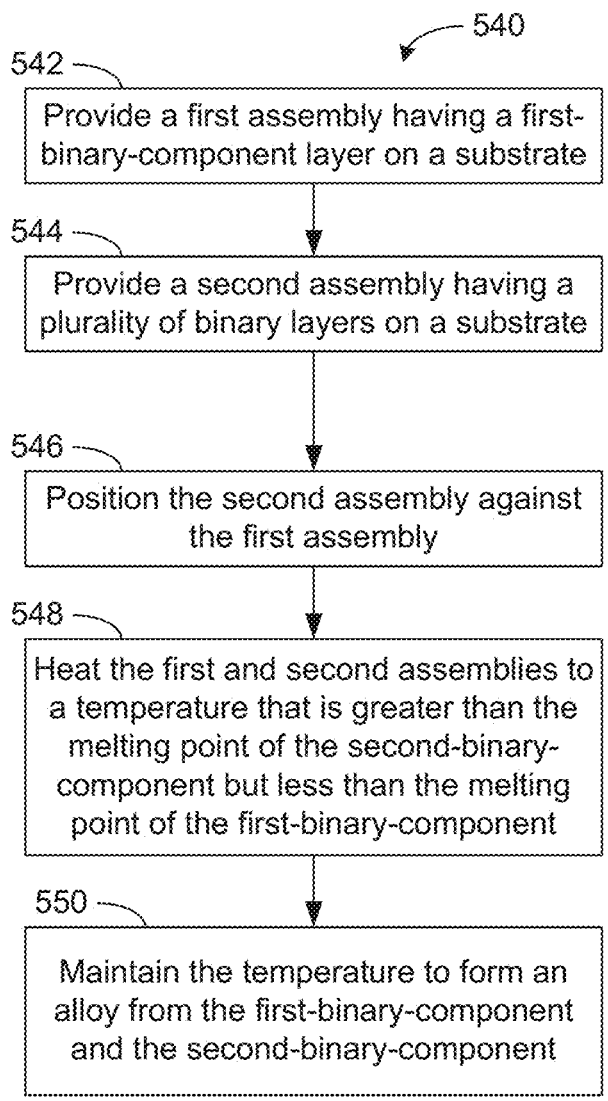
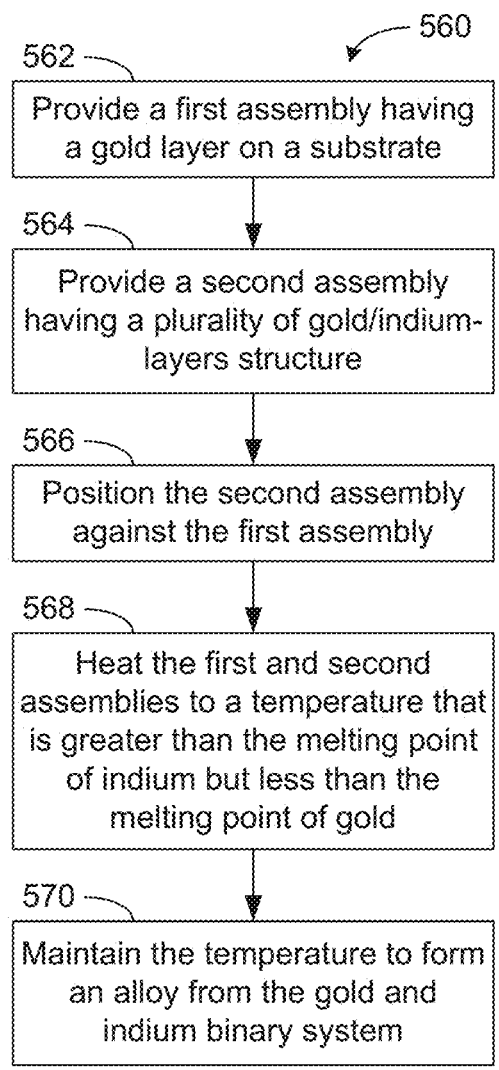
FIG. 30
FIG. 31

MULTILAYERED TRANSIENT LIQUID PHASE BONDING

RELATED APPLICATIONS

This application claims priority under 35 U.S.C. § 121 as a division of U.S. patent application Ser. No. 14/815,098, titled "MULTILAYERED TRANSIENT LIQUID PHASE BONDING," filed Jul. 31, 2015, which claims priority under 35 U.S.C. § 119(e) to U.S. Provisional Application Ser. No. 62/031,824, titled "COATED GRAIN TRANSIENT LIQUID PHASE SOLDER," filed on Jul. 31, 2014. Each of these applications is herein incorporated by reference in its entirety.

BACKGROUND

1. Field of Invention

Aspects and embodiments of the present invention are directed to metallization and/or bonding of electrical or electronic device components and/or components of packages for same.

2. Discussion of Related Art

In the art of electrical and electronic device fabrication and assembly, it is often desirable to make a substrate or surface (for example, a circuit board, ceramic monolithic microwave integrated circuit (MMIC) substrate, etc.) conductive. It is also often desirable to bond an electrical or electronic component to a substrate or to bond components of a package for an electronic component with a thermally and/or electrically conductive material. Processes for forming such conductive surfaces or bonds can face a number of challenges, for example, cost, the use of high temperatures incompatible with other process steps, difficulty in filling of hollow features of a substrate, and/or outgassing of byproducts incompatible with other process steps.

SUMMARY

In accordance with an aspect of the present invention, there is provided a bonding structure. The bonding structure includes a first layer of first alloy component disposed on a substrate and a first layer of a second alloy component disposed on the first alloy component. The second alloy component has a lower melting temperature than the first alloy component. A second layer of the first alloy component is disposed on the first layer of the second alloy component and a second layer of the second alloy component is disposed on the second layer of the first alloy component.

In some embodiments, the bonding structure further comprises a third layer of the first alloy component disposed on the second layer of the second alloy component.

In some embodiments, the bonding structure further comprises a first barrier layer configured to seal a surface of the second layer of the second alloy component from atmosphere and suppress oxidation of the surface of the second layer of the second alloy component. The barrier layer may include one or more of titanium, platinum, nickel, indium oxide, and tin.

In some embodiments, the bonding structure further comprises interfacial barrier layers disposed at interfaces between each layer of the first alloy component and each layer of the second alloy component, the barrier layers configured to suppress inter-diffusion of the first alloy component and the second alloy component. The interfacial barrier layers may include one or more of titanium, platinum, nickel, indium oxide, and tin.

In some embodiments, the first alloy component and the second alloy component are selected to inter-diffuse and form an alloy when the bonding structure is heated to a temperature above the melting temperature of the second alloy component and below the melting temperature of the first alloy component.

In some embodiments, a quantity of the first alloy component and a quantity of the second alloy component in the bonding structure are selected to form an alloy having a melting temperature between the melting temperature of the first alloy component and the melting temperature of the second alloy component.

In some embodiments, the first alloy component is gold and in some embodiments, the second alloy component is indium.

In some embodiments, the first alloy component and the second alloy component are a pair of components selected from the pairs of components including aluminum and germanium, gold and silicon, gold and tin, copper and tin, lead and tin, and indium and tin.

In some embodiments, an electronic component package is hermetically sealed with the bonding structure.

In some embodiments, an electronic device includes at least one component bonded to the substrate with the bonding structure. The electronic device may include at least one electrical contact in electrical communication with an electrical contact of the substrate via the bonding structure.

In accordance with another aspect, there is provided a method of forming a wireless device. The method comprises forming at least one module including a substrate having a radio frequency circuit and at least one device bonded to a portion of the radio frequency circuit with a first bonding structure. The first bonding structure includes a first layer of first alloy component disposed on a substrate, a first layer of a second alloy component disposed on the first alloy component, the second alloy component having a lower melting temperature than the first alloy component, a second layer of the first alloy component disposed on the first layer of the second alloy component, and a second layer of the second alloy component disposed on the second layer of the first alloy component.

In some embodiments, the at least one device is one of a power amplifier, a low noise amplifier, and an antenna switch module.

In some embodiments, the method further comprises hermetically sealing the at least one device is in a package with a second bonding structure including a first layer of first alloy component disposed on a substrate, a first layer of a second alloy component disposed on the first alloy component, the second alloy component having a lower melting temperature than the first alloy component, a second layer of the first alloy component disposed on the first layer of the second alloy component, and a second layer of the second alloy component disposed on the second layer of the first alloy component.

In some embodiments, the method further comprises forming an electrical connection between at least one electrical contact of the at least one device and at least one electrical contact of the radio frequency circuit with the first bonding structure.

In some embodiments, the method further comprises forming a transceiver and an antenna each in electrical communication with the at least one module.

In accordance with another aspect, there is provided a method of bonding a first assembly to a second assembly. The method comprises providing a first assembly including a first binary component layer disposed on a first substrate and providing a second assembly including a first layer of first alloy component disposed on a substrate, a first layer of a second alloy component disposed on the first alloy component, the second alloy component having a lower melting temperature than the first alloy component, a second layer of the first alloy component disposed on the first layer of the second alloy component, and a second layer of the second alloy component disposed on the second layer of the first alloy component. The method further comprises aligning the second assembly against the first assembly, heating the first assembly and second assembly to a temperature that is greater than a melting point of the second binary component but less than the melting point of the first binary component, and maintaining the temperature for a time sufficient for the layers of the first binary component to inter-diffuse with the layers of the second binary component to form an alloy from the first binary component and the second binary component.

In accordance with another aspect, there is provided a method of forming a bonding structure on a substrate. The method comprises forming a first binary component layer on the substrate forming a first barrier layer on the first binary component layer, and forming a second binary component layer on the first barrier layer. The first barrier layer includes a material that suppresses diffusion of the second binary component into the first binary component layer. The method further comprises forming a second barrier layer on the second binary component layer, forming another first binary component layer on the second barrier layer, forming a third barrier layer on the another first binary component layer, forming another second binary component layer on the third barrier layer, and forming a fourth barrier layer on the another second binary component layer. The fourth barrier layer includes a material that suppresses diffusion of oxygen from the atmosphere into the another second binary component layer.

In some embodiments, forming the second binary component layer comprises depositing material having a lower melting temperature than the first binary component on the first barrier layer.

In some embodiments, forming the second binary component layer comprises depositing material that will inter-diffuse with the first binary component to form an alloy upon heating of the bonding structure above the melting temperature of the second binary component.

In some embodiments, a quantity of the first binary component in the first binary component layer and in the another first binary component layer and a quantity of the second binary component in the second binary component layer and in the another second binary component layer are selected so that the alloy has a melting temperature between the melting temperature of the first binary component and the melting temperature of the second binary component.

In some embodiments, the method further comprises forming a further first binary component layer on the fourth barrier layer.

In some embodiments, depositing the first binary component layer comprises depositing a layer of gold on the substrate.

In some embodiments, depositing the second binary component layer comprises depositing a layer of indium on the first barrier layer.

In some embodiments, forming at least one of the first barrier layer, the second barrier layer, and the third barrier layer comprises depositing a layer of one or more of titanium, platinum, nickel, indium oxide, and tin.

In accordance with another aspect, there is provided a solder material comprising a plurality of coated grains, each grain including a core and a coating layer, the core and the coating layer selected to provide a transient liquid phase for the solder material.

In some embodiments, the core and the coating layer include materials capable of forming an alloy upon application of heat to the solder material. The coating layer material may have a melting temperature that is lower than a melting temperature of the core material. The application of heat may result in the coating layer being heated to a temperature greater than the melting temperature of the coating layer material but less than the melting temperature of the core material, to thereby liquefy the coating layer and allow the liquefied coating layer material to diffuse into the core material. The coating layer and the core may be dimensioned such that substantially all of the liquefied coating layer material is diffused into the core material to form the alloy.

In some embodiments, the alloy is electrically conductive. The core material may include gold. The coating layer material may include indium.

In some embodiments, each grain further includes an outer layer implemented on the coating layer, the outer layer configured to prevent or reduce oxidation of the coating layer. The outer layer may include gold.

In some embodiments, each grain further includes a barrier layer disposed between the coating layer and the core, the barrier layer configured to prevent or reduce premature diffusion between the coating layer and the core. The barrier layer may include titanium.

In accordance with another aspect, there is provided a method for fabricating a solder material. The method comprises forming or providing a plurality core particles and coating each of the core particles with a coating layer to yield a coated grain, the coated grain having a transient liquid phase property.

In accordance with another aspect, there is provided a method for forming a conductive alloy. The method comprises providing a solder material that includes a plurality of coated grains, each grain including a core and a coating layer, the core and the coating layer selected to provide a transient liquid phase for the solder material, heating the solder material to a temperature that is between melting temperatures of the coating layer and the core, the melting temperature of the coating layer less than the melting temperature of the core such that the coating layer becomes liquefied, and maintaining the heating until a substantial amount of the liquefied coating layer diffuses into the core to thereby form an alloy.

In some embodiments, the alloy has a melting temperature that is significantly higher than the temperature of the coating layer.

In accordance with another aspect, there is provided a method for forming a conductive feature on a substrate. The method comprises forming or providing a suspension of a plurality of coated grains in a solution, each grain including a core and a coating layer, the core and the coating layer selected to provide a transient liquid phase property, dispensing the suspension onto the substrate, evaporating at least some of the solution, heating the coated grains to a temperature that is between melting temperatures of the coating layer and the core, the melting temperature of the coating layer less than the melting temperature of the core such that the coating layer becomes liquefied, and maintaining the heating until a substantial amount of the liquefied coating layer diffuses into the core to thereby form a conductive alloy.

In some embodiments, the dispensing includes spin coating, spraying, or screen printing.

In some embodiments, the substrate includes a semiconductor wafer or a packaging substrate. The packaging substrate may include a laminate substrate or a ceramic substrate. The ceramic substrate may include a low-temperature co-fired ceramic substrate.

In some embodiments, the conductive feature is conductive pad or a conductive trace. The conductive feature may be a conductive layer configured to provide radio-frequency (RF) shielding functionality. The conductive layer may include a conformal conductive layer.

In accordance with another aspect, there is provided a packaged radio- frequency (RF) module. The packaged RF module comprises a packaging substrate that includes a ground plane, one or more components mounted on the packaging substrate, and a conductive layer implemented over the one or more components, the conductive layer electrically connected to the ground plane to provide RF shielding functionality for at least some of the one or more components, the conductive layer including an alloy resulting from heating of a solder material, the solder material including a plurality of coated grains, each grain including a core and a coating layer, the core and the coating layer selected to provide a transient liquid phase for the solder material.

In some embodiments, the packaged RF module further comprises an overmold encapsulating the one or more components, the conductive layer disposed on an upper surface of the overmold.

In some embodiments, at least some of the conductive layer is formed directly on the one or more components.

In some embodiments, the conductive layer further covers one or more sides of the packaging substrate so as to yield a conformal coverage along with the portion over the one or more components.

In accordance with another aspect, there is provided a method of forming a conductive feature on a semiconductor die. The method comprises depositing a layer of conductive material on the die using a coating material structure including a first layer of first alloy component, a first layer of a second alloy component disposed on the first alloy component, the second alloy component having a lower melting temperature than the first alloy component, a second layer of the first alloy component disposed on the first layer of the second alloy component, and a second layer of the second alloy component disposed on the second layer of the first alloy component, and patterning the layer of conductive material.

In accordance with another aspect, there is provided a method of forming an electronic component module including a substrate having an electrical circuit. The method comprises bonding at least one device to a portion of the electrical circuit with a bonding structure including a first layer of first alloy component disposed on the substrate, a first layer of a second alloy component disposed on the first alloy component, the second alloy component having a lower melting temperature than the first alloy component, a second layer of the first alloy component disposed on the first layer of the second alloy component, and a second layer of the second alloy component disposed on the second layer of the first alloy component.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIG. 8A illustrates an embodiment of a group of structures for a use in performing a bonding, sealing, or coating method at a first stage in the method;

FIG. 8B illustrates the embodiment of the group of structures of FIG. 8A at a second stage in the method;

FIG. 8C illustrates the embodiment of the group of structures of FIG. 8A at a third stage in the method;

FIG. 9A illustrates another embodiment of a structure for a use in performing a bonding, sealing, or coating method;

FIG. 9B illustrates another embodiment of a structure for a use in performing a bonding, sealing, or coating method;

FIG. 9C illustrates another embodiment of a structure for a use in performing a bonding, sealing, or coating method;

FIG. 10 illustrates a flowchart of an embodiment of a method for forming an embodiment of a structure for a use in performing a bonding, sealing, or coating method;

FIG. 11A illustrates an embodiment of a structure for a use in performing a bonding, sealing, or coating method after a first act of the method of FIG. 10;

FIG. 11B illustrates the structure for a use in performing the bonding, sealing, or coating method after a second act of the method of FIG. 10;

FIG. 28 illustrates a flowchart of an embodiment of a method for forming a bonding structure on a substrate;

FIG. 29 illustrates a flowchart of an embodiment of another method for forming a bonding structure on a substrate;

FIG. 30 illustrates a flowchart of an embodiment of a method for bonding a first assembly to a second assembly;

FIG. 31 illustrates a flowchart of another embodiment of a method for bonding a first assembly to a second assembly;

DETAILED DESCRIPTION

Figure 1:
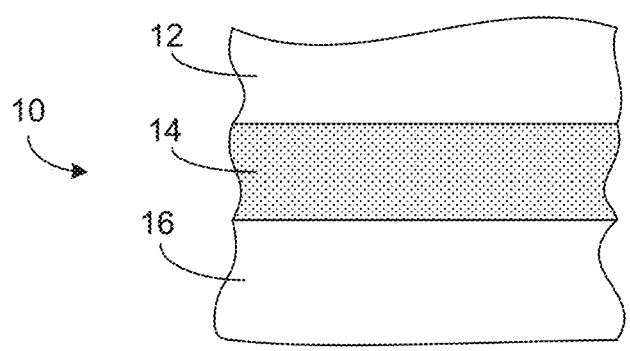
FIG. 1 illustrates a pair of substrates bonded to one another.

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," "having," "containing," "involving," and variations thereof herein is meant to encompass the items listed thereafter and equivalents thereof as well as additional items.

Disclosed herein are examples related to transient liquid phase (TLP) surface coating and bonding. In some embodiments, transient liquid phase surface coating or bonding is achieved through an application of a suspension of grains having a plurality of layers, followed by heating to cause the surface coating or bonding. In other embodiments, transient liquid phase surface coating or bonding is achieved through an application of a film having a plurality of layers to or between one or more surfaces, followed by heating to cause the surface coating or bonding. The resulting surface coating or bond can be used to, for example, join components, make a surface conductive, provide conductive paths within hollow features of a structure, etc. For example, in some embodiments, a transient liquid phase bonding process may be used to form a structure 10 as illustrated in FIG. 1 having a first substrate or component 12 bonded to a second substrate or component 16 with a layer of bonding material 14. In various embodiments, one or both of the substrates or components 12, 16 are active substrates, for example, semiconductor material substrates that may include one or more active devices. In other embodiments, one or both of the substrates or components 12, 16 may be mounting substrates, for example printed circuit boards or components of a package for an electronic device.

Figure 2:
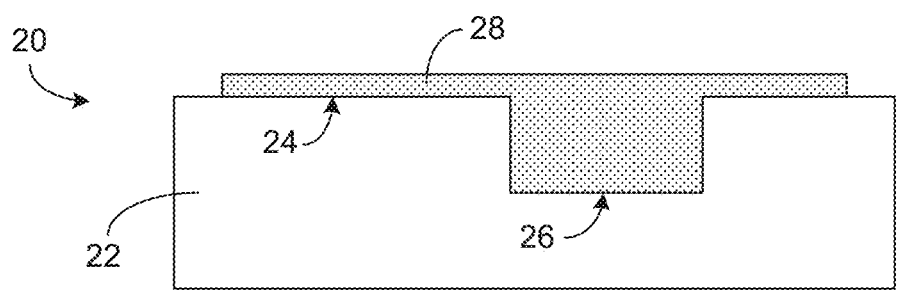
FIG. 2 illustrates a substrate conformally coated with a conductive material layer.

In some embodiments, a transient liquid phase surface coating process may be utilized to form a structure 20 as illustrated in FIG. 2 having an electrically conductive coating 28 bonded to an upper surface 24 of a substrate 22. The electrically conductive coating conformally covers the upper surface 24 of the substrate 22 and fills rough surface features and/or recesses, for example, recess 26. Like substrates 12 and 16 of FIG. 1, in various embodiments substrate 22 is one or more of an active semiconductor substrate, a mounting substrate, for example, a printed circuit board, and a component of a package for an electronic device.

In the following disclosure aspects and embodiments of transient liquid phase bonding are discussed. It is to be understood that the materials, structures, and techniques disclosed with respect to transient phase liquid bonding may also be applicable to processes of transient liquid phase surface coating and/or package sealing.

Transient phase liquid bonding is a multistage process whereby a multi-component system, for example, two metals capable of forming a binary alloy, are brought into contact, heated above the melting point of the component material having a lower melting point than the other component material, then held at a temperature for a time adequate for the two materials to inter-diffuse, thereby making the binary alloy.

In some embodiments, a TLP bonding structure may include more than three components. For example, in either the grain structures or the layered structures may be formed with at least one layer (or a core in embodiments of the grain structures) formed of an alloy of more than one material. Non limiting examples of TLP bonding structures utilizing more than two materials include structures utilizing gold and a lead-tin alloy and structures utilizing germanium and an aluminum-copper alloy. In some embodiments, where the alloy is the component material having a lower melting point than the other component material, the alloy may be a eutectic alloy.

In some embodiments, it has been found desirable to achieve true liquefaction of the lower temperature melting material. This provides for the resulting bond interface to effectively overcome challenges to a good bond, for example, device topology, surface roughness, etc.

It is also desirable to have the liquefaction of the lower melting point material occur since the diffusion of the high melting point component(s) into the lower melting point component in a liquid phase is typically orders of magnitude faster than solid state diffusion into the lower melting point component in solid phase.

If the materials are chosen correctly and the fractions of the low and high melting temperature components are chosen appropriately, the low melting temperature component layer can be fully alloyed with the high melting temperature component. The resulting alloyed structure can then have a higher melting point than that used to create the bond since all of the low melting temperature component has been alloyed by diffusion into a more refractory mix.

One binary system that is used as an example in this disclosure is the indium-gold system, with the indium being the low melting temperature component. There are many other binary TLP component systems which will behave similarly and this disclosure is not limited to only TLP structures and methods involving the indium-gold system.

Depending on the materials used, an intermetallic between the binary components can undesirably form even at room temperature, or during heating to the melting point of the low melting temperature component—but prior to liquefaction of the low melting temperature component. Premature intermetallic formation can undesirably consume some or all of the low melting temperature component such that the liquefaction is less effective at conformally covering topology/roughness within the bond area.

For this reason, rather thick layers of the low melting temp material have been used in the past to ensure that despite ongoing low temperature diffusion there is sufficient thickness of the low temperature melting component remaining when the TLP structure reaches the melting point of the low melting temperature component.

Using these thicker layers of low melting temperature component can require one to bond for longer times to complete the inter-diffusion of components during the bonding process due to the longer length scale required for atoms to move by diffusion.

In addition, thicker low melting temperature component layers have been known to be easier to "squeeze out" when the bonding process reaches the melting point and force is applied to make the bond.

Thus a TLP material system is desirable that may be utilized to form a structure that won't prematurely alloy, will alloy quickly and/or completely during bonding, and won't squeeze out during the bonding process.

Figure 3:
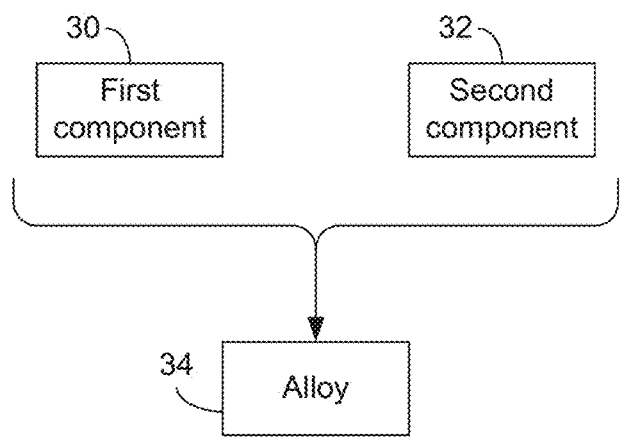
FIG. 3 illustrates an alloy system in accordance with an embodiment.

In some implementations, transient phase liquid bonding is a multistage process utilizing a multi-component system, for example, a binary alloy 34 that includes a first component material 30 and a second component material 32 (FIG. 3). The first component material 30 and the second component material 32 may both be metals. The first component material 30 and second component material 32 are brought into contact at a first temperature below the melting point of both the first component material 30 and the second component material 32. The two component materials 30, 32 are heated to a temperature above the melting point of the component material 30, 32 having a lower melting point than the other component material 30, 32. The two component materials 30, 32 are then held at a temperature for a time adequate for the two component materials 30, 32 to inter-diffuse, for example, for the lower melting point material to diffuse into the higher melting point material, thereby making the alloy 34.

A significant advantage of a transient liquid phase bond is that the resulting alloy can have a higher melting point than the temperature used to make the bond. This is due to inter-diffusion of the constituent components resulting in an alloy having a higher melting point than the lower melting point material, and in some instances a melting point between the melting point of the lower melting point material and the melting point of the higher melting point material.

In some embodiments, and as an example, a multi-component system includes a plurality of grains where indium (In, melting point of 156.6 degrees C.) is used as a coating layer outside of a gold (Au, melting point of 1,064 degrees C.) core lying within the interior of each grain. The low melting point constituent such as indium can be selected to wet and bond well to the chosen application site or substrate, and/or to other grains.

A plurality of such layered grains to be alloyed can, for example, be placed in a volatile liquid to form a suspension which is disposed on a substrate by spin coating, spraying, or screen printing. The liquid nature of the suspension can provide advantageous features such as low application/processing cost, a low processing temperature, conformal filling of recessed features, etc.

Preparation of the foregoing suspension can include preparing grains of a high melting point material coated with a low melting point material that inter-diffuses with the high melting material, thereby resulting in a high melting point alloy. This can be achieved, for example, through sol gel preparation followed by electro-less coating. Alternatively, preparation of such grains can include spray powder formation, traditional ball milling, or other methods of small grain production.

In some embodiments, an additional layer of a non-oxidizing material (for example, another layer of gold) can be formed over the indium layer to prevent or reduce oxidation of the indium before bonding.

In some applications, use of a diffusion barrier between low and high melting point materials can prevent or reduce premature diffusion alloying before the material is heated with the intent to drive reaction to a refractory alloy. In the foregoing grain structure example, an intermediate coating of the diffusion barrier layer can be provided between the low and high melting point materials to prevent or reduce their premature inter-diffusion.

The foregoing grains and applications of such grains (for example, in suspension) can provide a number of advantages. For example, a resulting network would not have flux or residual organic material to burn off as with other alternative epoxy based methods of application. In another example, one does not need to rely on mechanical contact in a matrix for conductivity such as in an application using simple metallic particle suspension. In yet another example, the grains having one or more features as described herein can be diffusion soldered to any metal that readily alloys with the system.

In some implementations, one can extend one or more of the features as described herein to yield a porous conducting network capable of being assembled at relatively low temperature with the appropriate choice of, for example, grain sizes and coating thicknesses. One can also utilize one or more features of the present disclosure to configure a system having more than a binary functionality. One can also utilize one or more features of the present disclosure to configure grain cores that are non-conducting and/or non-alloying, if desired.

Figure 5:
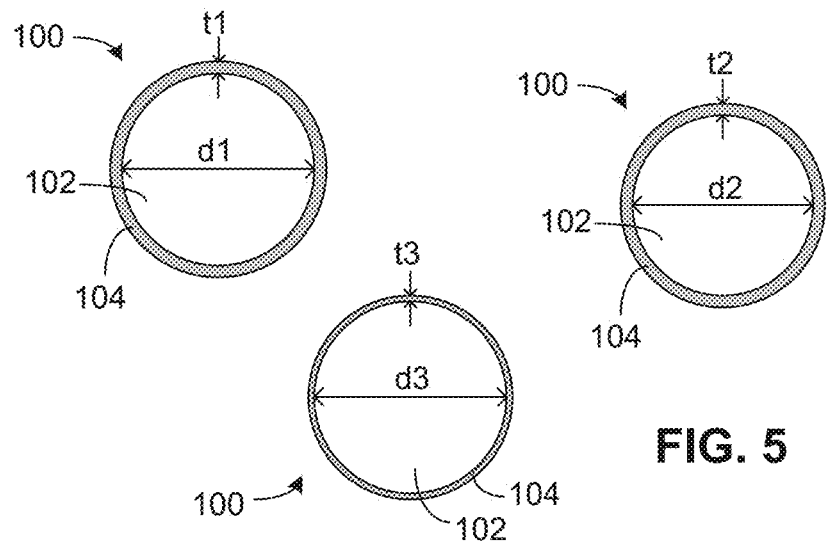
FIG. 5 illustrates embodiments of a structure for a use in performing a bonding, sealing, or coating method.

FIG. 5 illustrates grains 100 having cores 102 and coating layers 104 so as to form a binary system. In some embodiments, the size of the core 102 (for example, diameter d1, d2, or d3) and/or the thickness of the coating layer 104 (for example, thickness t1, t2, or t3) can be selected for a particular application. Such selected core dimensions and coating layer thickness can be average values or be in some ranges. For example, the core dimensions and coating layer thickness may be selected such that on average, the relative amounts of core material and coating material in the population of grains are sufficient to form an alloy having a higher melting temperature than the coating material when the grains are fully alloyed.

In some embodiments, materials for the core 102 and the coating layer 104 of the grain 100 are selected to yield a binary alloying system. In some embodiments, the coating layer material is selected to have a lower melting temperature than that of the core material. Further, an alloy resulting from the coating layer 104 and the core 102 can have a melting temperature that is significantly higher than the melting temperature of the coating layer material. In various examples described herein, the core 102 is described as being gold (Au, melting point of 1,064 degrees C.), and the coating layer 104 is described as being indium (In, melting point of 156.6 degrees C.). However, it will be understood that other combinations of materials can also be utilized. Examples of other material systems that may be used in various embodiments disclosed herein include, but are not limited to, aluminum (Al, melting point of 660 degrees C.)—germanium (Ge, melting point of 938 degrees C.) (eutectic alloy melting point of 450 degrees C.), Au-silicon (Si, melting point of 1,414 degrees C.) (eutectic alloy melting point of 363 degrees C.), Au-tin (Sn, melting point of 232 degrees C.) (eutectic alloy melting points of 217 degrees C. (93.7% Sn) and 278 degrees C. (29% Sn)), copper (Cu, melting point of 1,085 degrees C)—Sn (eutectic alloy melting point of 270 degrees C.), lead (Pb, melting point of 327 degrees C)—Sn (eutectic alloy melting point of 183 degrees C.), and In—Sn (eutectic alloy melting point of 120 degrees C.). Alloys of these materials having compositions other than the eutectic compositions have higher melting points than the eutectic compositions. At least some alloys of these materials have melting temperatures higher than that of the component with the lower melting temperature. For ease of description, aspects and embodiments disclosed herein are described as including alloying components of Au and In, however, it should be understood that any one or more of these other alloy systems may be substituted for the Au—In system.

Figure 6:
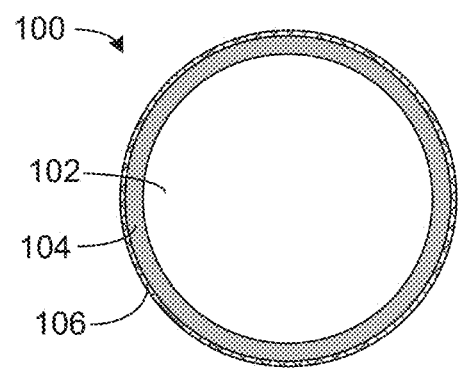
FIG. 6 illustrates another embodiment of a structure for a use in performing a bonding, sealing, or coating method.

FIG. 6 shows that in some embodiments, a grain 100 having a core 102 and a coating layer 104 may further include an outer layer 106 configured to, for example, prevent or reduce oxidation of the coating layer 104. Such an outer layer can be formed from, for example, gold. The outer layer 106 is sufficiently thin, while providing the foregoing protective functionality, to allow the coating layer 104 to be heated. In some embodiments an outer layer 106 that is only a few nanometers thick, for example, less than about 10 nanometers thick provides adequate protection against oxidation of the coating layer 104. As described herein, once heated appropriately, the outer layer 106 and the core 102 can form an alloy with the coating layer 104.

In the foregoing example, the outer layer 106 is described as having the same material as the core 102. However, it will be understood that the outer layer 106 can be formed from material that is different than the core 102. For example, in some embodiments, the outer layer 106 may be formed of one or more materials including, but not limited to, titanium (Ti) platinum (Pt), nickel (Ni), indium oxide ($In_2O_3$), tin (Sn), and combinations or alloys of same.

Figure 7:
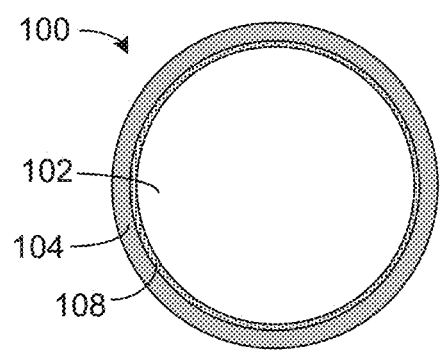
FIG. 7 illustrates another embodiment of a structure for a use in performing a bonding, sealing, or coating method.

FIG. 7 shows that in some embodiments, a grain 100 having a core 102 and a coating layer 104 may further include a barrier layer 108 disposed between the core 102 and the coating layer 104. Such a barrier layer can be configured to, for example, prevent or reduce inter-diffusion between the core 102 and the coating layer 104.

For example, if an indium coating layer 104 is put in direct contact with a gold core 102, intermetallic diffusion can occur even at room temperature within each grain. Using a diffusion barrier layer 108 such as titanium (Ti) can prevent such premature inter-diffusion, and yet not interfere with the desired inter-diffusion upon the indium liquefying. By way of an example, a titanium layer having a thickness in a range of 200 Å-400 Å can be disposed between the indium layer and the gold core to prevent or reduce the premature alloying of the indium layer and the gold core. Other materials that may be utilized for the barrier layer include platinum (Pt), nickel (Ni), indium oxide ($In_2O_3$), tin (Sn), and combinations or alloys of same.

Figure 4:
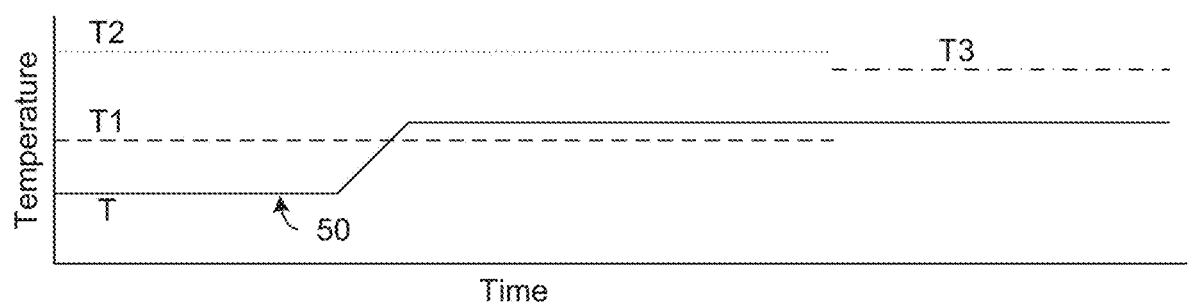
FIG. 4 illustrates a temperature profile utilized in embodiments of a bonding, sealing, or coating method.

FIGS. 4 and 8A-8C illustrate an example of an alloying process that can be implemented utilizing grains such as those described with reference to FIGS. 5-7. FIG. 4 shows a temperature profile 50 as a function of time as the grains (for example, applied in suspension form) are heated. FIGS. 8A-8C illustrate example states at various stages of such a heating process.

In an unheated state 120, a plurality of grains 100 are shown to form a network (FIG. 8A). Such a network can be formed by, for example, application of the grains 100 in a suspension form on surfaces and/or features of a substrate. As described herein, the grains 100 are shown to have their respective cores 102 and coating layers 104. In such an unheated state, the temperature of the grains 100 is shown to be T, and the coating layers are in un-melted form.

When the network of grains 100 are heated to a temperature that is greater than the melting temperature T1 of the coating layer material but less than the melting temperature T2 of the core material, the coating layers 104 are shown to be liquefied in state 130 (FIG. 8B). Such liquefied material 132 of the coating layers 104 is shown to flow between neighboring grains. In such a heated state, the liquefied coating layer material 132 diffuses into the core material.

When the foregoing heating temperature is maintained for a time sufficient to allow the foregoing diffusion, an alloyed state 140 (FIG. 8C) can result. In such a state, alloyed grains 142 are shown to form a network. Such an alloyed network is shown to have a melting temperature T3 that is significantly higher than the melting temperature T1 of the coating layer 102 material. In the example shown, the melting temperature T3 of the network of alloyed grains 142 is shown to be less than the melting temperature T2 of the core material.

In the context of the example indium-gold binary system, the melting temperature T3 of the resulting alloy varies, depending on the relative amounts of the indium and gold. When the percent weight of indium in the binary system is zero, the system is essentially gold, and its melting temperature is approximately 1,064 degrees C. As the percent weight of indium increases, the melting temperature of the resulting alloy decreases, and reaches a valley of about 458 degrees C. when the indium content is about 25% by weight. As the percent weight of indium increases further, the melting temperature of the resulting alloy increases and reaches a peak value of about 510 degrees C. when the indium content is about 37% by weight. As the percent weight of indium increases further, the melting temperature of the resulting alloy decreases and reaches a valley value of about 495 degrees C. when the indium content is about 42% by weight. As the percent weight of indium increases further, the melting temperature of the resulting alloy increases and reaches a peak value of about 541 degrees C. when the indium content is about 54% by weight. As the percent weight of indium increases further, the melting temperature of the resulting alloy decreases to the melting temperature of approximately 156.6 degrees C. when the indium content is 100% by weight.

Based on the foregoing examples, one can see that there is a large range of melting temperatures of the indium-gold alloy (for example, less than 50% of indium by weight) that is significantly higher (for example, greater than or equal to about 458 degrees C.) than the melting temperature of indium (156.6 degrees C.). In some embodiments, the amount of indium in the grains (and therefore in the alloy) can be selected based on factors such as the foregoing increased melting temperature (of the alloy), electrical property of the alloy, mechanical property of the resulting alloy network, and/or the alloying process.

In the context of the example grains having gold cores and indium coating layers, and as described in reference to FIGS. 5-7, the indium content can be varied by, for example, varying the coating layer thickness t1, t2, t3 relative to the core diameter d1, d2, d3. When the thickness of the indium coating layer is in a desired range (for a given diameter of the gold core), there can be sufficient amount of indium for a relatively quick diffusion process into the gold core without significant amount of excess indium. Accordingly, the coating layer thickness t1, t2, t3 and/or the core diameter d1, d2, d3 can be adjusted to preferably yield such an alloying process. It will be understood that such thickness and diameter values or ranges can be average values or ranges among the grains.

It is noted that if there is insufficient amount of indium (for example, due to the coating layer being too thin), a layer of alloy can form in the cores, and the alloying process can self-terminate when the liquefied indium runs out. In such a situation, the inner portions of the cores can remain as highly conductive gold. If the heating process is continued for a long time, the indium can be driven further into the core; however, such a lengthy process may not be desirable in a quick and low-temperature alloying process.

It is also noted that if there is too much indium (e.g., due to the coating layer being too thick), the resulting alloy can have higher resistivity. In some applications, such higher resistivity of the alloy may or may not be desirable. Further, there may be excess indium that is not diffused into the core, thereby resulting in indium reflow. In such a situation, the excess indium having relatively high resistance can undesirably melt and reflow at relatively low temperature during a subsequent process step involving heating.

In the various examples described in reference to FIGS. 5-8C, the grains 100 are depicted as being generally spherical. FIGS. 9A-9C show that grains 100 having one or more features as described herein do not necessarily need to have spherical shapes. FIG. 9A is a spherical shaped example grain 100 similar to the examples described in reference to FIGS. 5-8C. FIG. 9B shows an example grain 100 that has a generally rounded shape (for example, an ellipsoid), but not a spherical shape. As described herein, such a grain can include a core portion 102 and a coating layer portion 104.

FIG. 9C shows that in some embodiments, a grain 100 does not necessarily need to have a rounded shape, and can include one or more sharp features such as corners. The example grain 100 of FIG. 9C is shown to have a polygonal sectional shape. As described herein, such a grain can include a core portion 102 and a coating layer portion 104. It will be understood that grains having one or more features as described herein can have other shapes than those illustrated. Further, it will be understood that non-spherical grains may also include coating layers 104 as illustrated in FIG. 6 and/or barrier layers 108 as illustrated in FIG. 7.

FIG. 10 illustrates a process 150 that can be implemented to manufacture coated grains having one or more features as described herein. FIGS. 11A and 11B shows example states of such a process.

In block 152, core particles are provided or formed. In FIG. 11A, one of such core particles is depicted at 102. In block 154, coating layers are formed on the core particles. In FIG. 11B, a coating layer 104 is depicted as being formed on the core particle 102.

Figure 12:
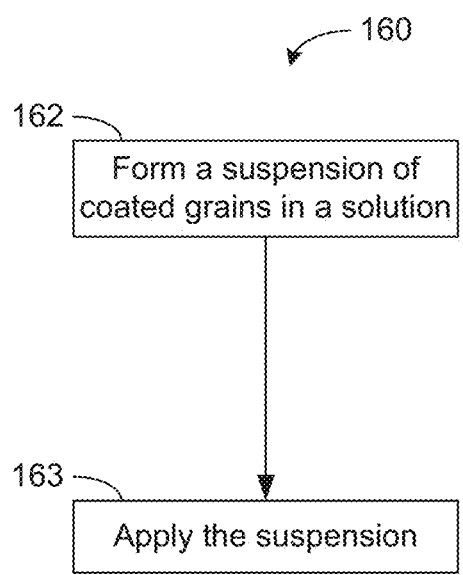
FIG. 12 illustrates an embodiment of a method of applying embodiments of a structure for a use in performing a bonding, sealing, or coating method on an object.
Figure 13A:
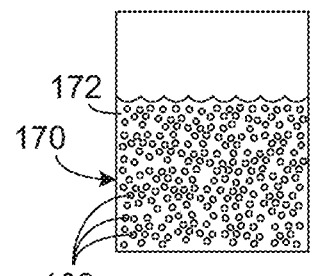
FIG. 13A illustrates a suspension of embodiments of a structure for a use in performing a bonding, sealing, or coating method.
Figure 13B:
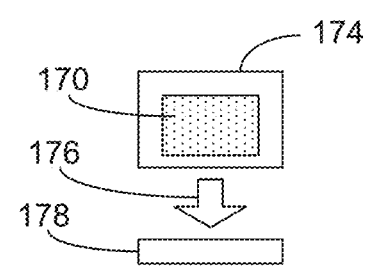
FIG. 13B illustrates the suspension of FIG. 13A being applied to an object.

FIG. 12 shows a process 160 that can be implemented to apply grains having one or more features as described herein. FIGS. 13A and 13B show example states of such a process.

In block 162, a suspension of coated grains is formed in a solution. In FIG. 13A, such a suspension is depicted at 170, where coated grains 100 are suspended in a solution 172. In block 163, the suspension can be applied. In FIG. 13B, the suspension 170 is depicted as being dispensed (arrow 176) from a dispensing apparatus 174 onto a substrate 178.

Figure 14A:
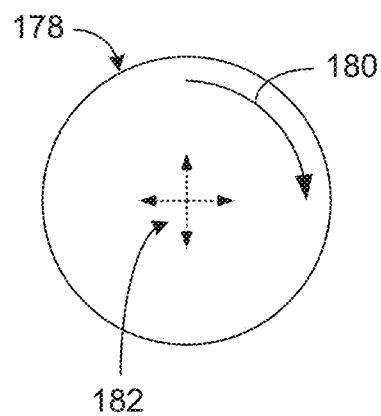
FIG. 14A illustrates a wafer upon which embodiments of structures for a use in performing a bonding, sealing, or coating method may be applied.

FIG. 14A shows that in some implementations, a substrate on which the foregoing suspension of coated grains is applied can be a semiconductor wafer 178. Such an application can be achieved by, for example, a spin application where the wafer 178 is spun while the suspension is applied at or close to the center of the wafer 178. Due to the spinning 180 of the wafer 178, the suspension on the wafer 178 migrates outward (arrows 182).

Figure 14B:
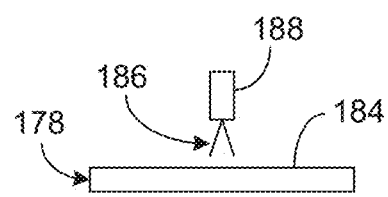
FIG. 14B illustrates application an embodiment of structures for a use in performing a bonding, sealing, or coating method to the wafer of FIG. 14A.

FIG. 14B shows a side view of the spin application example of FIG. 14A. By way of an example the suspension can be sprayed 186 from a dispensing apparatus 188 onto a center portion of a surface 184 of the wafer 178. Such sprayed suspension can then move outward due to the spinning of the wafer 178.

In some embodiments, a wafer can include an array of units 190 that will become individual die when singulated.

Figure 14C:
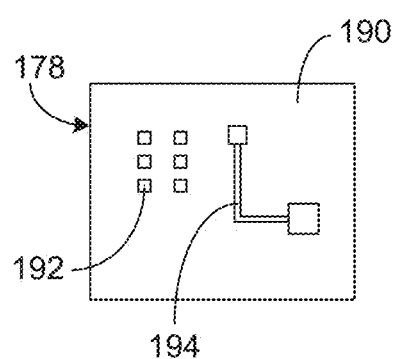
FIG. 14C illustrates features of a device formed on the wafer of FIG. 14A with the embodiment of the structures for use in performing the bonding, sealing, or coating method.

FIG. 14C shows an example of such a unit 190, where conductive features, for example, contact pads 192 and conductive traces 194 can be formed from patterning of a conductive layer formed as described herein utilizing the coated grains. In other embodiments, the conductive layer is formed from an embodiment of a layered bonding structure as described below, for example, with reference to FIGS. 26A-26C or 27A-27C. Such conductive features are examples of features formed on a surface. In some embodiments, the coated grains can also be used to fill or coat 3-dimensional features such as vias, recesses, side walls, etc., in substrates such as wafers, packaging substrates (for example, laminate substrates and ceramic substrates), and circuit boards. Examples of such applications are described in greater detail below.

FIGS. 15A-15F illustrate non-limiting examples of conductive features that can be formed using coated grains having one or more features as described herein. As described herein, such conductive features can be utilized to join parts together, to form a conductive path or layer, or any combination thereof.

Figure 15A:
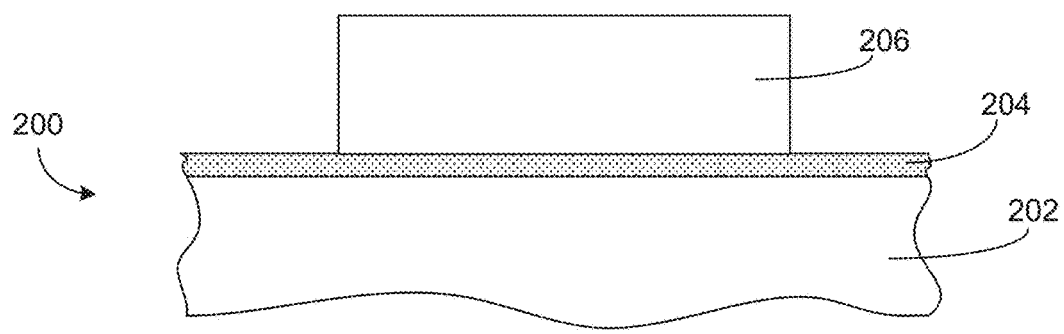
FIG. 15A illustrates a device bonded to a substrate with an embodiment of structure or method disclosed herein.

In an example configuration 200 of FIG. 15A, a conductive layer 204 can be utilized to mount a component 206 (for example, a die, surface mount technology (SMT) device, etc.) on a substrate 202 (for example, a packaging substrate). To achieve such a mounting, a layer of un-alloyed grains can be formed on the substrate 202, followed by positioning of the component 206. The assembly can then be heated to a low temperature that is higher than the melting temperature of the coating layer as described herein, to thereby form an alloy layer between the substrate 202 and the component 206.

Figure 15B:
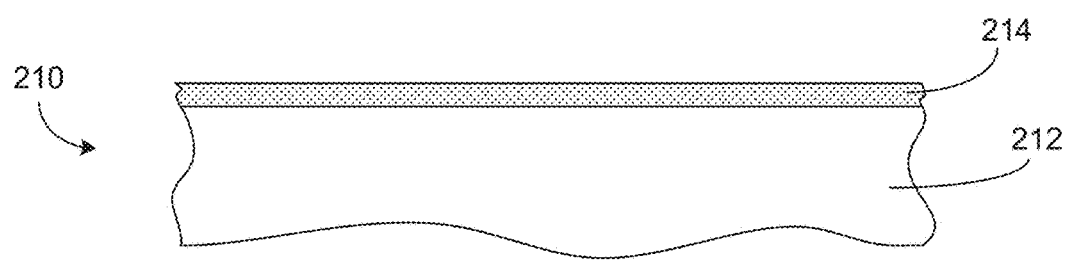
FIG. 15B illustrates a substrate coated with an electrically conductive film with an embodiment of structure or method disclosed herein.

In an example configuration 210 of FIG. 15B, a conductive layer 214 is formed on an underlying structure 212. By way of a non-limiting example, the structure 212 can be an overmold structure implemented on a packaging substrate, and such a conductive layer 214 can be utilized as a radio-frequency (RF) shield. Such a conductive layer can be electrically connected to a ground plane within the packaging substrate (not shown) through, for example, shielding wirebonds, a conductive component, a conductive layer on one or more of the side walls, or any combination thereof.

Figure 15C:
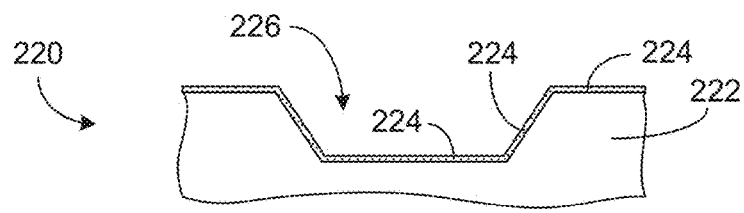
FIG. 15C illustrates another substrate coated with an electrically conductive film with an embodiment of structure or method disclosed herein.
Figure 15D:
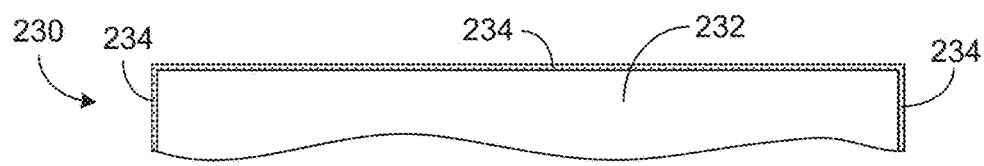
FIG. 15D illustrates another substrate coated with an electrically conductive film with an embodiment of structure or method disclosed herein.

FIGS. 15C and 15D show examples where conductive layers formed as described herein can conform to three dimensional surfaces. In an example configuration 220 of FIG. 15C, a conductive layer 224 formed with coated grains as described herein can conform to a recess 226 defined by a structure 222. Such a structure can be, for example, an overmold structure formed over a packaging substrate. By way of an example, the recess 226 can be formed on the upper surface of the overmold structure to expose an upper surface of a component (not shown) configured to provide an electrical connection between its upper surface and the packaging substrate (for example, to a ground plane therein). Once such an upper surface is exposed, the conductive layer 224 can be formed, and such a layer can conform to the contour of the upper surface of the overmold structure and the recess 226. In some embodiments, such a conformal conductive layer 224 can be utilized as an RF shield.

In an example configuration 230 of FIG. 15D, a conductive layer 234 formed with coated grains as described herein can conform to an upper surface and side surfaces of a package 232. Such a package can include, for example, a combination of an overmold and a packaging substrate, with one or more components mounted on the packaging substrate and encapsulated by the overmold. In some embodiments, a box shaped module having such a conformal conductive layer 234 can cover five of the six sides, except the bottom side (which is used to mount to, for example, a circuit board). Such a conformal conductive layer 234 can be electrically connected to a ground plane within the packaging substrate through, for example, conductive features that are exposed to the uncoated side walls. In some embodiments, the packaging substrate can be a laminate substrate or a ceramic substrate such as a low-temperature co-fired ceramic (LTCC) substrate. In some embodiments, the upper portion of such a packaging substrate can include an overmold structure (such as in the example of FIG. 15D). In other embodiments, the conformal conductive layer can also cover components and features without an overmold structure, as well as the side walls of the packaging substrate.

Figures 15E, 15F:
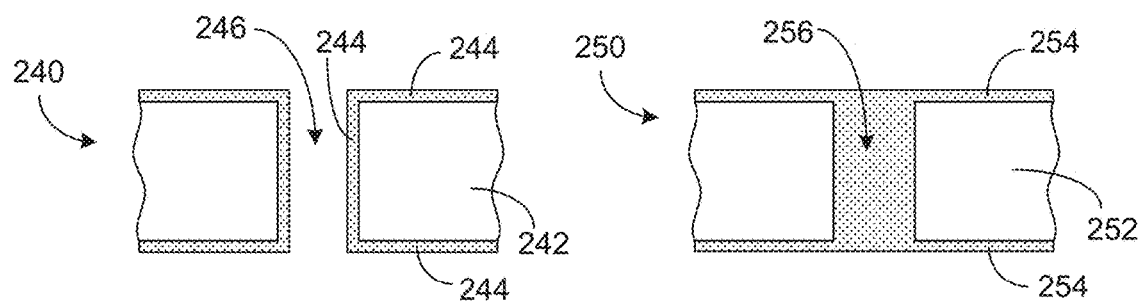
FIG. 15E illustrates a via formed in a substrate and coated with an electrically conductive film with an embodiment of structure or method disclosed herein.
FIG. 15F illustrates a via formed in a substrate and filled with an electrically conductive material with an embodiment of structure or method disclosed herein.

FIGS. 15E and 15F show examples where coated grains having one or more features as described herein can be utilized to form conductive vias. In an example configuration 240 of FIG. 15E, a via 246 formed between upper and lower sides of a substrate 242 (for example, a wafer, one or more layers of a packaging substrate, etc.) can be made conductive by formation of a layer 244 resulting from alloying of the coated grains as described herein. In an example configuration 250 of FIG. 15F, a via 256 between upper and lower sides of a substrate 252 (for example, a wafer, one or more layers of a packaging substrate, etc.) can be filled with conductive material resulting from alloying of the coated grains as described herein.

Figure 16A:
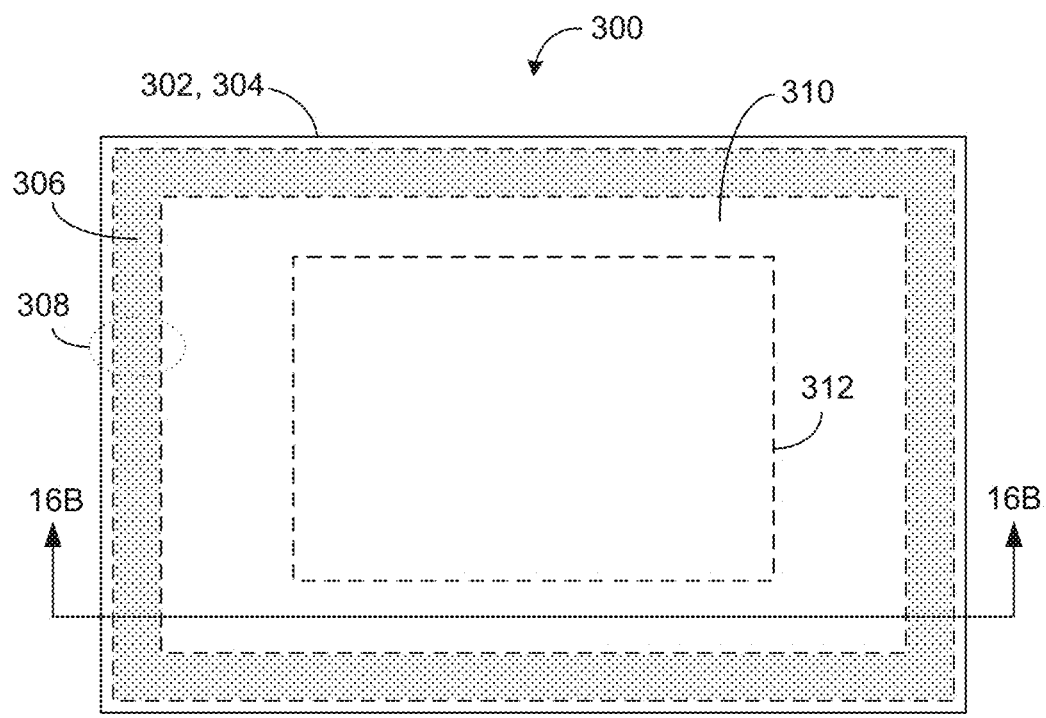
FIG. 16A is a plan view of an embodiment of package including a hermetically sealed device.
Figure 16B:
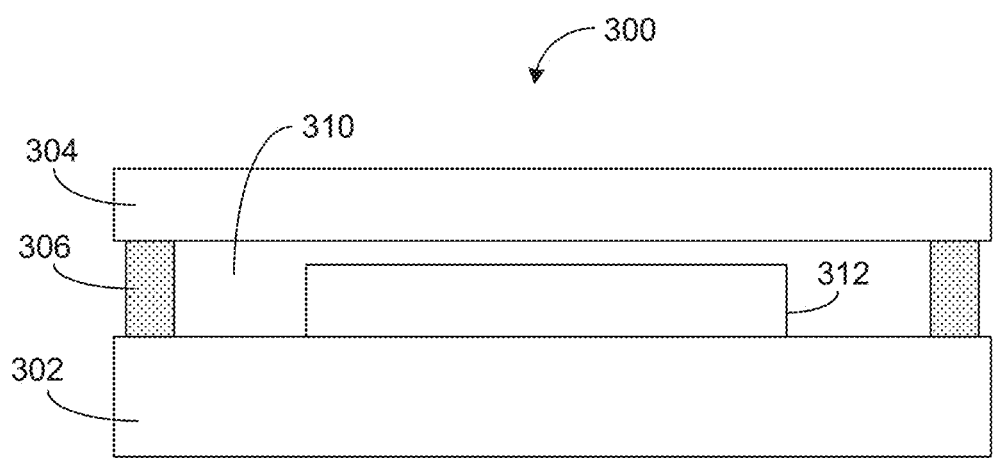
FIG. 16B is a cross section of the package of FIG. 16A.

In some embodiments, a method of transient liquid phase bonding may be used to produce a hermetic seal about an electronic or electromechanical component in a package. One example of this is illustrated in FIGS. 16A and 16B in which a method of transient liquid phase bonding is used to seal a package 300 for a device 312. In the example illustrated in FIGS. 16A and 16B a bond between a base substrate 302, for example, a semiconductor substrate, and a cap substrate 304, for example a glass, sapphire, or semiconductor substrate, is formed with material structures, for example, the coated grains disclosed above or the layered structures disclosed below, capable of forming a transient liquid phase bond between the substrates 302, 304. The TLP material structures 308 are deposited on one (or both) of the substrates 302, 304, to form a closed geometric shape, for example, the rectangle 306 illustrated in FIG. 16A that encloses an area or cavity 310 in which a device 312, for example, a microelectromechanical system (MEMS) device, a surface acoustic wave (SAW) device, a bulk acoustic wave (BAW) device, or a film bulk acoustic wave (FBAW) device is mounted. The substrates 302, 304 are brought together and the TLP material structures 308 are heated to a temperature above the melting temperature of a lower melting point material in the TLP material structures 308. The temperature of the TLP material structures 308 is maintained at or above the temperature above the melting temperature of the lower melting point material until the materials of the TLP material structures 308 at least partially or completely inter-diffuse to form an alloy. The resulting alloy forms a hermetic seal about the area or cavity 310 in which the device 312 is mounted.

Figure 17A:
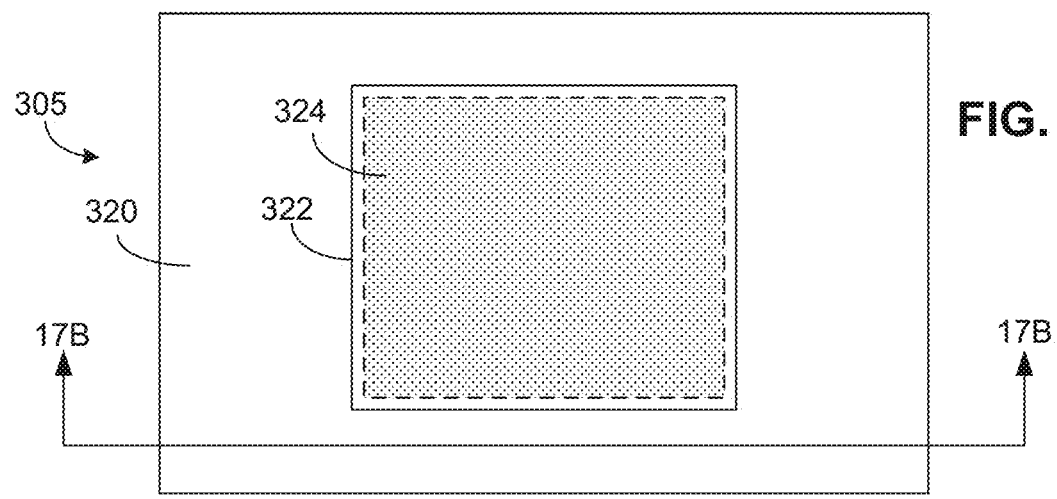
FIG. 17A illustrates an embodiment of a device bonded to a substrate with an embodiment of structure or method disclosed herein.
Figure 17B:
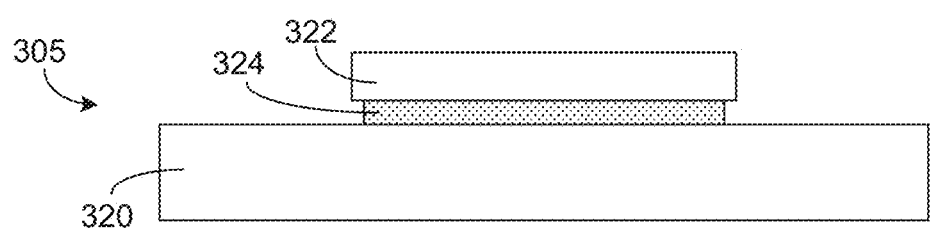
FIG. 17B illustrates a cross section of the device and substrate of FIG. 17A.

In some embodiments, as illustrated in FIGS. 17A and 17B, a method of transient liquid phase bonding may be used to mount a device 322 on a substrate 320 to form a structure 305. A bond between the substrate 320, for example, a semiconductor substrate or a printed circuit board, and the device 322, is formed with material structures, for example, the coated grains disclosed above or the layered structures disclosed below, capable of forming a transient liquid phase bond between the substrate 320 and device 322. The TLP material structures 324 are deposited on a portion of an upper surface of the substrate 320 and/or on a lower surface of the device 322. The substrate 320 and device 322 are brought together and the TLP material structures 324 are heated to a temperature above the melting temperature of a lower melting point material in the TLP material structures 324. The temperature of the TLP material structures 324 is maintained at or above the temperature above the melting temperature of the lower melting point material until the materials of the TLP material structures 324 at least partially or completely inter-diffuse to form an alloy. The resulting alloy forms an electrically and thermally conductive bond between the device 322 and the substrate 320.

Figure 18A:
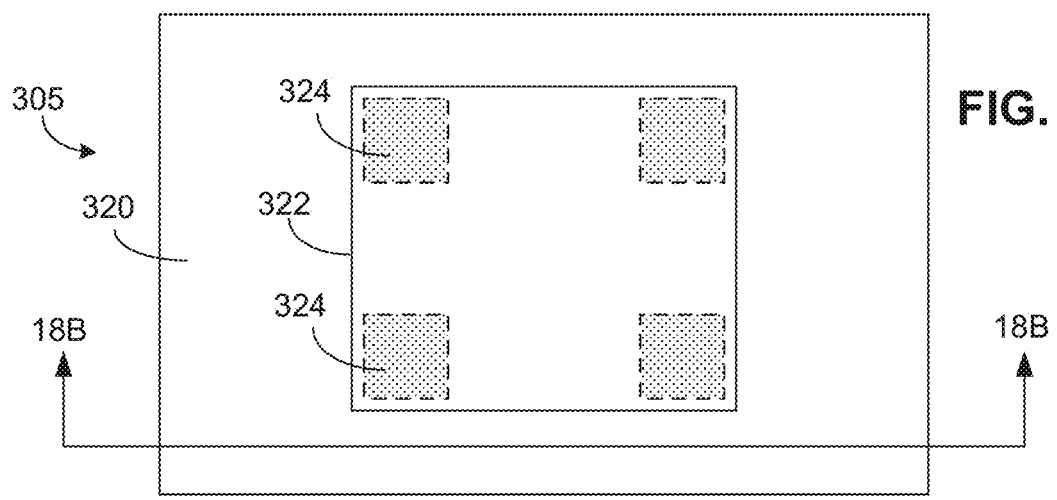
FIG. 18A illustrates an embodiment of a device electrically coupled to a substrate with an embodiment of structure or method disclosed herein.
Figure 18B:
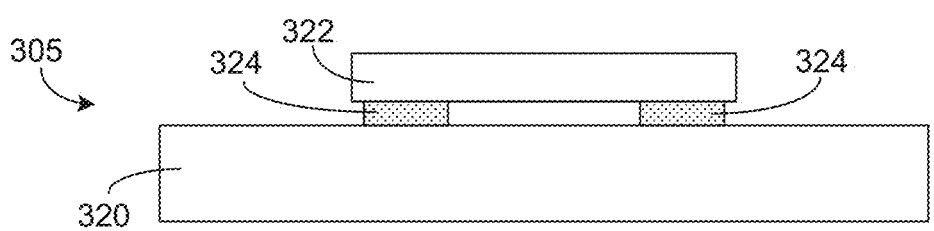
FIG. 18B illustrates a cross section of the device and substrate of FIG. 18A.

In some embodiments, for example, as illustrated in FIGS. 18A and 18B, the bond formed between the device 322 and substrate 320 is used to form one or more electrical paths between electrical contacts, for example, bond pads on the device 322 and substrate 320. In such embodiments, instead of covering substantially the entire area between the device 322 and the substrate 320 as in FIGS. 17A and 17B, the TLP material structures 324 are deposited on a plurality of separated areas on the lower surface of the device 322 and/or upper surface of the substrate 320. At least one electrical contact is disposed on the upper surface of the substrate 320 and on the lower surface of the device 322 within at least one of the separated areas.

In some embodiments, the device 312 of FIGS. 16A and 16B may be bonded to the substrate 302 using a method as illustrated in either of FIGS. 17A and 17B or FIGS. 18A and 18B. The TLP material structures may thus be used to form both a hermetic seal for the device 312 in the package 300 and for providing electrical communication between electrical contacts on the device 312 and the substrate 302.

Figure 19:
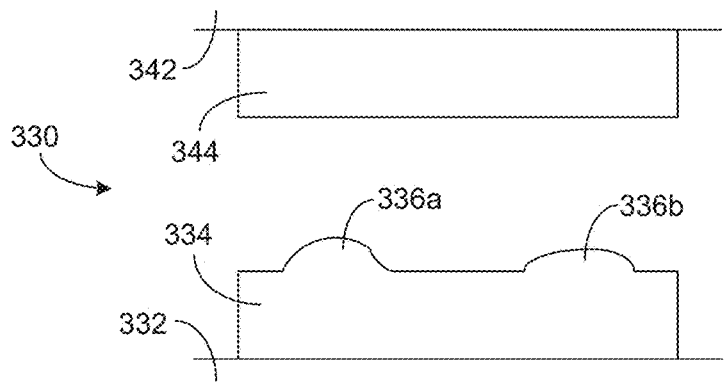
FIG. 19 illustrates a first portion of an embodiment of a method of bonding a first assembly to a second assembly.

A method of bonding the surfaces of two substrates is illustrated in FIGS. 19-22. FIG. 19 illustrates at 330 a first substrate 332 and a second substrate 342 that are to be joined. A first layer of gold 334 is deposited on the illustrated surface of the first substrate 332 and a second layer of gold 344 is deposited on the illustrated surface of the second substrate 342. Surface irregularities, illustrated as pair of gold bumps 336a, 336b are present on the upper surface of the first layer of gold 334 opposite the surface of the first layer of gold 334 disposed on the illustrated surface of the first substrate 332. The first and second gold layers 334, 344 have thicknesses that may range from between about 10 nm and about 10 µm, although embodiments disclosed herein are not limited to having gold layers of any particular thicknesses.

Figure 20:
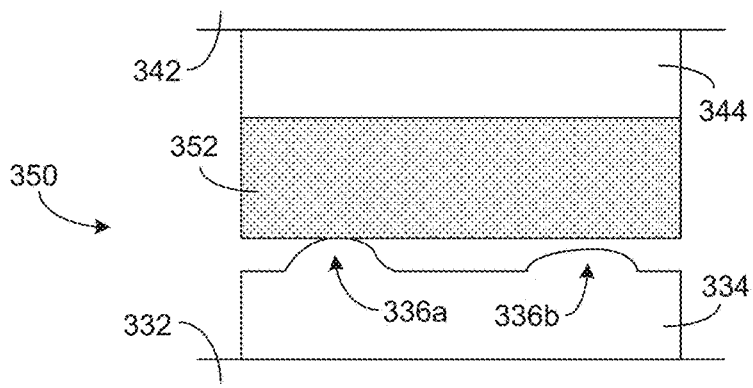
FIG. 20 illustrates a second portion of an embodiment of a method of bonding a first assembly to a second assembly.

In FIG. 20 a layer of a bonding material 352, for example, indium, has been added to the lower surface of the second layer of gold 344 opposite the surface of the second layer of gold 344 disposed on the illustrated surface of the second substrate 342 to form structure 350. The indium may be added by a physical or chemical deposition process, a plating process, or any other process of metal deposition known in the art.

Figures 21, 22:
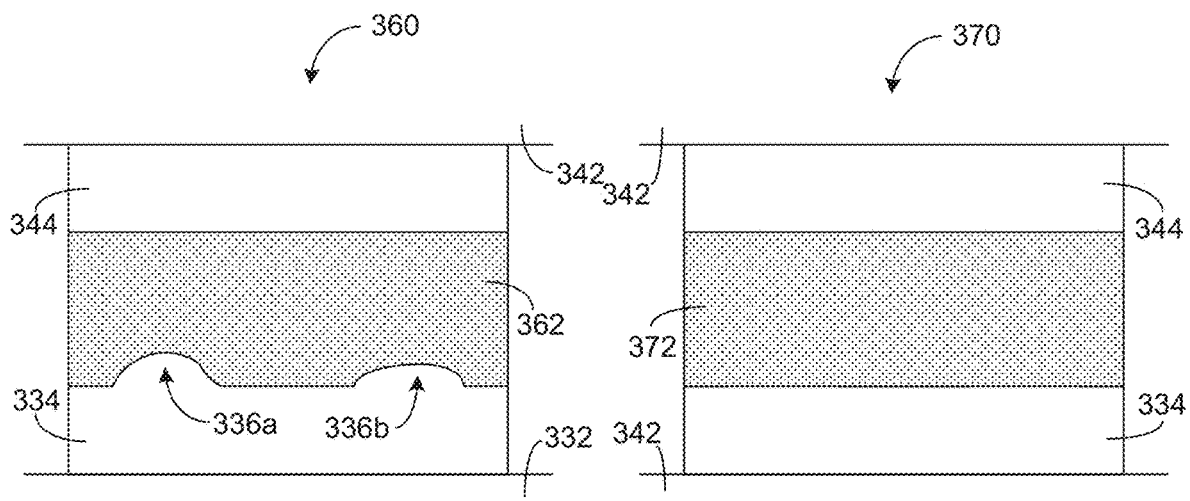
FIG. 21 illustrates a third portion of an embodiment of a method of bonding a first assembly to a second assembly.
FIG. 22 illustrates a fourth portion of an embodiment of a method of bonding a first assembly to a second assembly.

FIG. 21 illustrates a structure 360, which is formed from structure 350 by bringing the substrates together so the bonding material layer 352 comes into contact with the first layer of gold 334 and heating the bonding material layer 352 to a temperature at which it melts and conforms to the upper surface of the first layer of gold 334, forming molten bonding layer 362. The structure 360 is maintained at an elevated temperature for a period of time sufficient for gold from the first layer of gold 334 and from the second layer of gold 344 and the indium to inter-diffuse to form alloy bonding layer 372 in structure 370. The elevated temperature at which the alloy bonding layer is formed is, in some embodiments, above the melting temperature of the indium and below the melting temperature of the gold. In other embodiments, the elevated temperature at which the alloy bonding layer is formed is below the melting temperature of the indium. The heat is removed upon formation of the alloy bonding layer 372.

The method illustrated in FIGS. 19-22 may suffer from disadvantages. For example, if the surface of the indium to be bonded to the first layer of gold 334 is left uncovered and exposed to air it may form a surface layer of indium oxide that may interfere with the bonding process. Further, the gold in the second layer of gold 344 may inter-diffuse with the layer of indium 352 to form a gold-indium alloy prior to the bonding process or during heating to the desired bonding temperature, reducing the amount of unalloyed indium available for forming the desired bond.

Figure 23A:
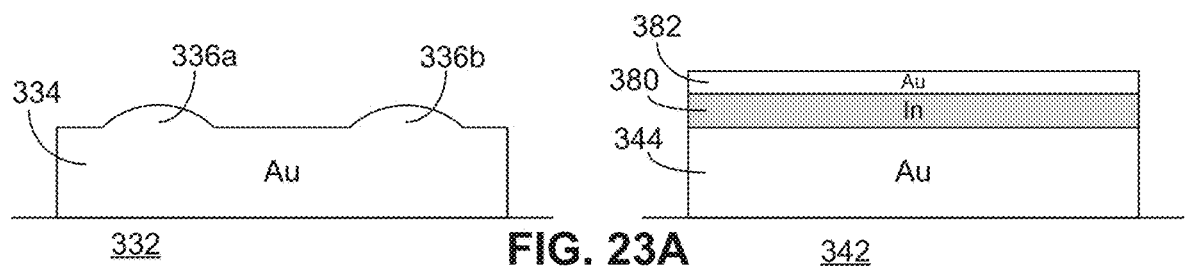
FIG. 23A illustrates a first portion of an embodiment of a method of bonding a first assembly to a second assembly.
Figure 23B:
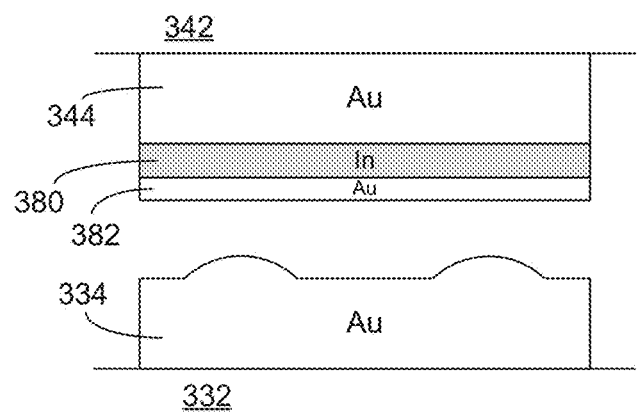
FIG. 23B illustrates a second portion of an embodiment of a method of bonding a first assembly to a second assembly.

Another method of bonding a pair of substrates is illustrated in FIGS. 23A-23D. FIG. 23A illustrates the pair of substrates 332, 342 to be joined. First substrate 332 has a first layer of gold 334 including gold bumps 336a and 336b deposited on it, similar to substrate 332 of FIG. 19. Second substrate 342 has a second layer of gold 344 deposited on it, similar to substrate 342 of FIG. 19. Second substrate 342 of FIG. 23A also has a layer of a bonding material 380, for example, indium, deposited on the second gold layer 344 and a third layer of gold 382 deposited on the layer of bonding material. The layer of bonding material 380 of FIG. 23A is thinner than the layer of bonding material 352 illustrated in FIG. 20. FIG. 23B illustrates the first and second substrates 332, 342 aligned for bonding.

Figure 23C:
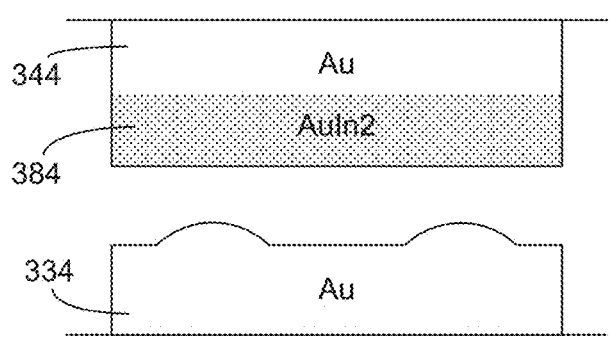
FIG. 23C illustrates a third portion of an embodiment of a method of bonding a first assembly to a second assembly.

The third layer of gold 382 deposited on the layer of bonding material 380 seals the layer of bonding material 380 from the atmosphere, reducing or eliminating the tendency of the layer of bonding material 380 to form a surface oxide. In some embodiments, the third layer of gold 382 may be at least about 15 nanometers thick to provide acceptable suppression of oxidation of surface of the layer of bonding material 380. However, room temperature diffusion or diffusion as the structure of FIG. 23B is heated to bonding temperature causes gold from the second gold layer 344 and from the third gold layer 382 to inter-diffuse with the material of the bonding layer, forming an alloyed material, for example, $AuIn_2$ as illustrated in FIG. 23C. This effect is more pronounced with thinner rather than thicker bonding material layers. If the bonding material layer is too thin, or if inter-diffusion takes place for too long or at too high a temperature, the entire layer of bonding material 380 may be alloyed.

Figure 23D:
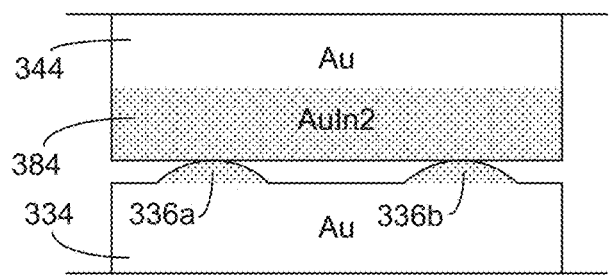
FIG. 23D illustrates a fourth portion of an embodiment of a method of bonding a first assembly to a second assembly.

The alloy layer 384 formed from the inter-diffusion of the gold and bonding material may have a melting temperature higher than the pure bonding material, as is the case in the gold-indium system. The alloy layer 384 thus, in some embodiments, will not melt at the desired bonding temperature, and as illustrated in FIG. 23D will not flow to conform to the surface of the first gold layer 334. Some interdiffusion may occur between the alloy layer 384 and the gold bumps 336a, 336b, but the alloy layer will not bond to the remainder of the surface of the first gold layer 334, rendering the bond between the first and second substrate 332, 334 weak.

Figure 24A:
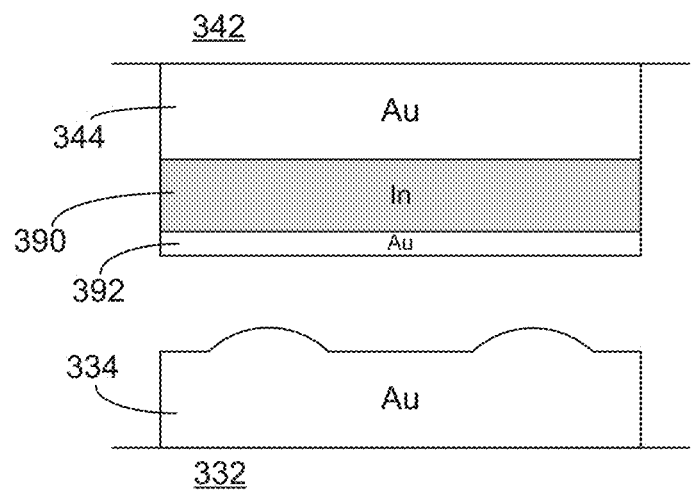
FIG. 24A illustrates a first portion of an embodiment of a method of bonding a first assembly to a second assembly.
Figure 24B:
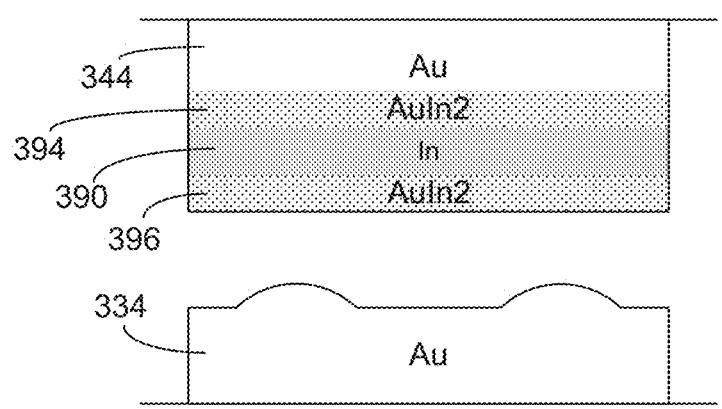
FIG. 24B illustrates a second portion of an embodiment of a method of bonding a first assembly to a second assembly.
Figure 24C:
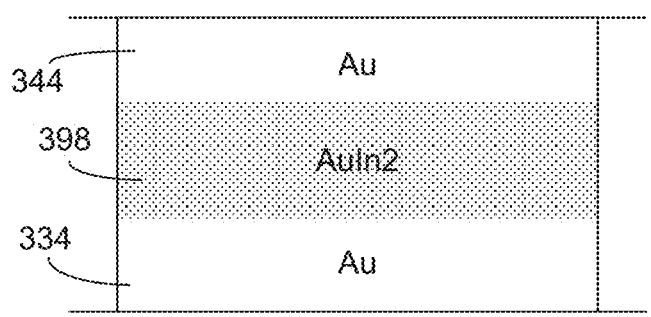
FIG. 24C illustrates a third portion of an embodiment of a method of bonding a first assembly to a second assembly.

FIG. 24A illustrate a configuration of substrates and bonding layer structures similar to that of FIG. 23A. In FIG. 24A, however, the layer of bonding material 390 is thicker than the layer of bonding material 380 in FIG. 23A. In the structure of FIG. 24A the thicker layer of bonding material 390 may prevent total alloying of the bonding layer. A first alloy layer 394 and a second alloy layer 396 may form by inter-diffusion of the material of the layer of bonding material and the second gold layer 344 and third gold layer 392, respectively, but a layer of unalloyed bonding material may remain within the bonding material layer as illustrated in FIG. 24B. The unalloyed bonding material melts at the desired bonding temperature and flows about the gold bumps in the first gold layer 334 forming a conformal bond between the substrates 332, 342 as shown in FIG. 24C. The unalloyed bonding material is alloyed during the bonding process by additional inter-diffusion between the bonding material and the gold layers, resulting in the alloyed layer of bonding material 398 illustrated in FIG. 24C. The resultant bond is stronger than that illustrated in FIG. 23D due to the increased contact area between the alloyed bonding material and the first gold layer 334.

Figure 25A:
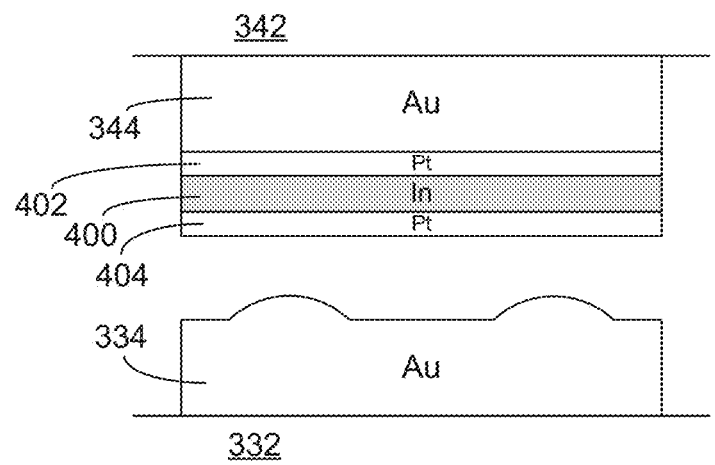
FIG. 25A illustrates a first portion of an embodiment of a method of bonding a first assembly to a second assembly.
Figure 25B:
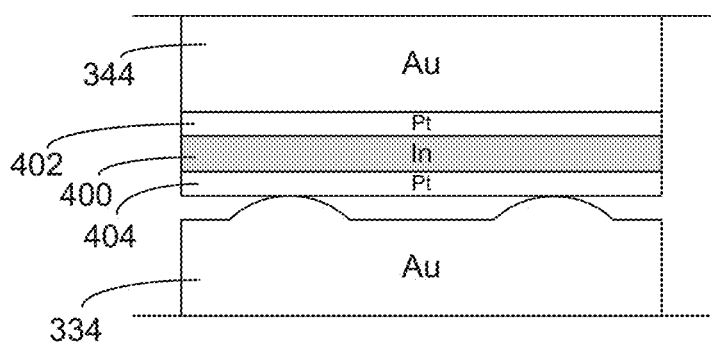
FIG. 25B illustrates a second portion of an embodiment of a method of bonding a first assembly to a second assembly.
Figure 25C:
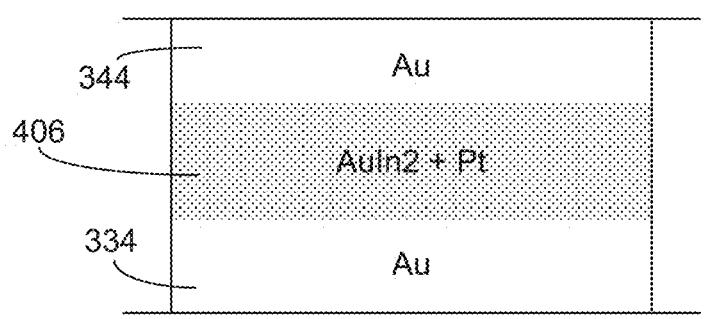
FIG. 25C illustrates a third portion of an embodiment of a method of bonding a first assembly to a second assembly.

A further method and associated structure for bonding a pair of substrates is illustrated in FIGS. 25A-25C. In FIG. 25A the first substrate 332 and first gold layer 334 and the second substrate 342 and second gold layer 344 are similar to those illustrated in FIGS. 19, 23A, and 24A. The bonding material layer 400, for example, a layer of indium, is a thin layer similar to the bonding material layer 380 of FIG. 23A. The layer of indium may be only as thick as necessary to not be fully alloyed prior to reaching a liquid state and/or to produce enough liquid indium to provide conformal coverage over surface irregularities on the first gold layer 334. Unlike the structure shown in FIG. 23A, an upper diffusion barrier layer 402 (also referred to as a "barrier layer") is deposited between the layer of bonding material 400 and the second gold layer 344, and a lower diffusion barrier layer 404 (also referred to as a "barrier layer") is deposited on the lower surface of the layer of bonding material opposite the surface on which the upper diffusion barrier layer 402 is formed. The upper diffusion barrier layer 402 is formed of a material that suppresses or blocks diffusion of gold from the second gold layer 344 into the layer of bonding material 400. The lower diffusion barrier layer 404 is formed of a material that seals the layer of bonding material from the atmosphere to suppress or eliminate oxidation of the surface of the layer of bonding material 400 that is to be bonded to the first gold layer 334. The upper diffusion barrier layer 402 and the lower diffusion barrier layer 404 are formed of a material that does not rapidly inter-diffuse with the material of the layer of bonding material 400, or at least that inter-diffuses with the material of the layer of bonding material at a rate slower than that of gold. The barrier material and thickness of the upper diffusion barrier layer 402 and the lower diffusion barrier layer 404 are chosen appropriately to reduce unwanted low temperature premature alloying of the binary system. In some embodiments, the upper diffusion barrier layer 402 and the lower diffusion barrier layer 404 may have thicknesses of about 15 nanometers or more and provide acceptable suppression of diffusion of the component materials of the bonding structure and of oxygen into the bonding material layer 400. In FIGS. 25A and 25B, the upper diffusion barrier layer 402 and the lower diffusion barrier layer 404 are illustrated as formed from the same material—platinum. In other embodiments, the upper diffusion barrier layer 402 and the lower diffusion barrier layer 404 are formed from different materials. Suitable materials for the upper diffusion barrier layer 402 and/or the lower diffusion barrier layer 404 include, for example, titanium, platinum, nickel, indium oxide, tin, and combinations thereof.

As illustrated in FIG. 25B as compared to FIG. 24B, as the bonding structure including the layer of bonding material 400 and the upper diffusion barrier layer 402 and lower diffusion barrier layer 404 is heated and brought into contact with the first gold layer, premature alloying of the layer of bonding material 400 is suppressed. The unalloyed bonding material thus melts and flows about the bumps in the first gold layer 334 to form a conformal bond with the first gold layer 334. After maintained at a suitable temperature for a suitable time to allow for the material of the upper and lower diffusion barrier layers 402 and 404 and the gold from the first and second gold layers 334, 344 to inter-diffuse with the material of the layer of bonding material the bonded structure of FIG. 25C results. This structure includes an alloyed bonding layer conformally bonded to both the first and second gold layers 334, 344.

Figure 26A:
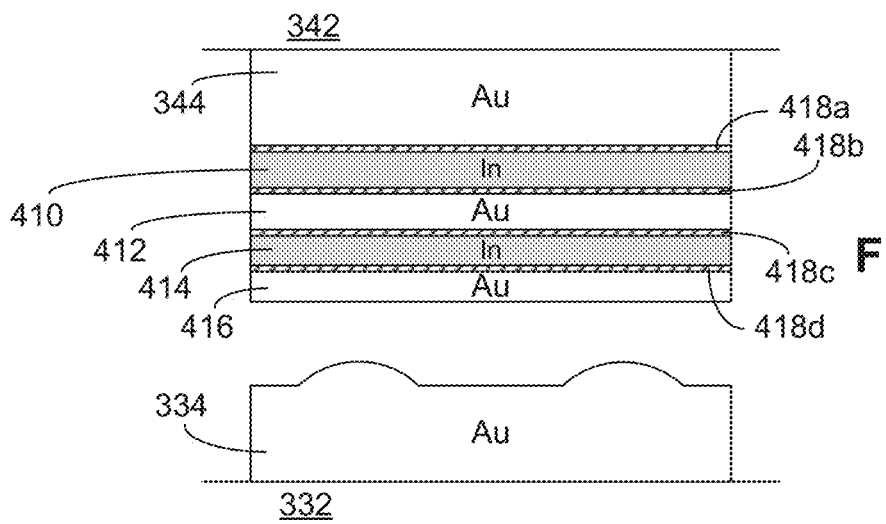
FIG. 26A illustrates a first portion of an embodiment of a method of bonding a first assembly to a second assembly.
Figure 26B:
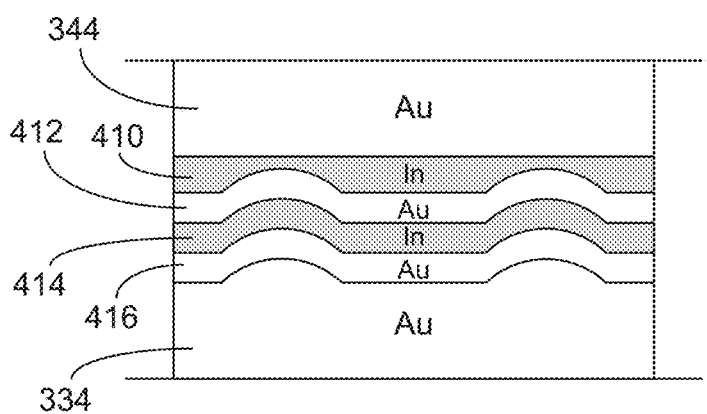
FIG. 26B illustrates a second portion of an embodiment of a method of bonding a first assembly to a second assembly.
Figure 26C:
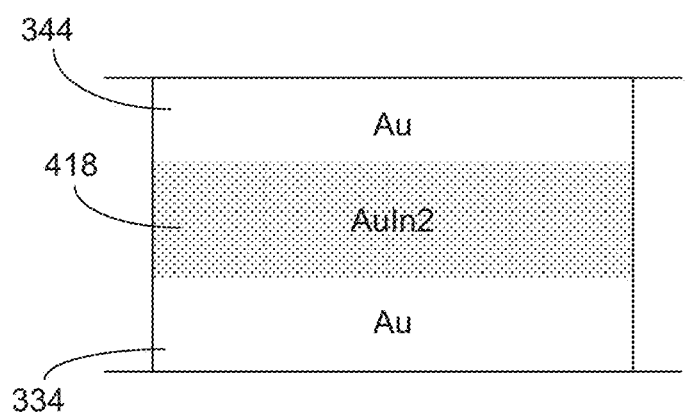
FIG. 26C illustrates a third portion of an embodiment of a method of bonding a first assembly to a second assembly.

In accordance with another aspect disclosed herein transient liquid phase bonding is performed with a bonding structure including one or more stacked films of one or more bonding components as illustrated in FIGS. 26A-26C. The stacked films may be substantially planar. The stacked films include a multitude of interposed layers of the high and low melting point materials rather than a single thicker pair of layers. In FIG. 26A, the higher melting point material layers are illustrated as gold layers 412, 416 and the lower melting point layers of bonding material are illustrated as indium layers 410, 414. The amount of bonding material in each layer of bonding material 410, 414 may be less than would be desired to form a conformal bond between a pair of substrates, however, the total amount of bonding material in the multiple layers of bonding material is selected to be sufficient to provide a conformal bond between substrates. The layers of bonding material (for example, indium) 410, 414 may be only as thick as necessary to not be fully alloyed prior to reaching a liquid state and/or to produce enough liquid phase bonding material to provide conformal coverage over surface irregularities on the first gold layer 334. The layers 412, 416 of the high melting point material may be only as think as necessary to provide sufficient material to fully alloy with the full quantity of bonding material in the layers of bonding material 410, 414.

The bond will happen faster when providing a bonding structure including a plurality of thinner high melting point material layers and layers of bonding material instead of a single thicker layer of bonding material disposed between layers of the higher melting point material because diffusion (or inter-diffusion) has to proceed only through thinner layers of material to achieve complete alloying of the bonding structure. Further, in the structure illustrated in FIG. 26A where higher melting point material layers (gold layers 344, 412, 416) are provided on both upper and lower surfaces of the layers of bonding material 410, 414 inter-diffusion of the higher melting point material and the material of the layers of bonding material 410, 414 proceeds from both sides of the layers of bonding material 410, 414. In some embodiments, full alloying of the bonding structure of FIG. 26A may occur in as little as between about 10 minutes and 15 minutes at about 270 degrees C. This is in contrast with traditional gold-gold thermocompression bonding which may require heating to about 400 degrees C. for about 30 minutes. The bonding structure of FIG. 26A thus introduces less thermal energy into devices or substrates undergoing bonding resulting in less concern for diffusion of material in the formed devices or substrates that might otherwise reduce the reliability of the devices or resultant bonded component.

Another advantage of providing a bonding structure including a plurality of thinner high melting point material layers and a plurality of layers of bonding material instead of a single thicker layer of bonding material disposed between layers of the higher melting point material is that thinner layers of low melting point material in the layers of bonding material will be less likely to "squeeze out" of the desired bonding area during bonding due to higher viscous forces in thinner films.

As further illustrated in FIG. 26A, in some embodiments, barrier layers 418*a*, 418*b*, 418*c*, 418*d* are disposed at each interface between the high melting point material (the gold layers 344, 412, and 416) and the layers of bonding material (indium layers 410, 414). The barrier material and thickness are chosen appropriately to reduce unwanted low temperature premature alloying of the binary system (the gold layers and the indium layers). The material and thickness of the layers in the bonding structure of FIG. 26A are further chosen to give an appropriate rate of alloying at elevated temperature, for example, at a temperature at or above the melting point of the low melting temperature material of the layers of bonding. The barrier layers are in various embodiments formed of one or more of, for example, titanium, platinum, nickel, indium oxide, tin, and combinations thereof.

The layers of bonding material (for example, indium) 420, 424 may be only as thick as necessary to not be fully alloyed prior to reaching a liquid state and/or to produce enough liquid phase bonding material to provide conformal coverage over surface irregularities on the first gold layer 334. The layers 412, 416 of the high melting point material may be only as think as necessary to provide sufficient material to fully alloy with the full quantity of bonding material in the layers of bonding material 410, 414. In some embodiments, the barrier layers 418*a*, 418*b*, 418*c*, 418*d* may have thicknesses of about 15 nanometers or more and provide acceptable suppression of diffusion of the component materials of the bonding structure and of oxygen into the bonding material layers 420, 424.

As illustrated in FIG. 26B as the bonding structure including the layers 410, 412, 414, and 416 is heated and brought into contact with the first gold layer 334, the layers of bonding material melt and the bonding structure forms a conformal bond with the first gold layer 334. The formation of the conformal bond may occur at least in part by the thin layers of high melting temperature material 412, 416 deforming about surface irregularities such as the illustrated bumps in the first gold layer 334. Additionally or alternatively, molten material from the layers of bonding material 410, 414 may flow about surface irregularities in the first gold layer 334 to form a conformal bond. As illustrated in FIG. 26C, the bonding structure is maintained at a temperature and time suitable to form an alloyed bonding layer 418 conformally bonded to the first gold layer 334 and the second gold layer 344, bonding together these layers and any substrates, devices, or components on which the gold layers 334, 344 are deposited.

Figure 27A:
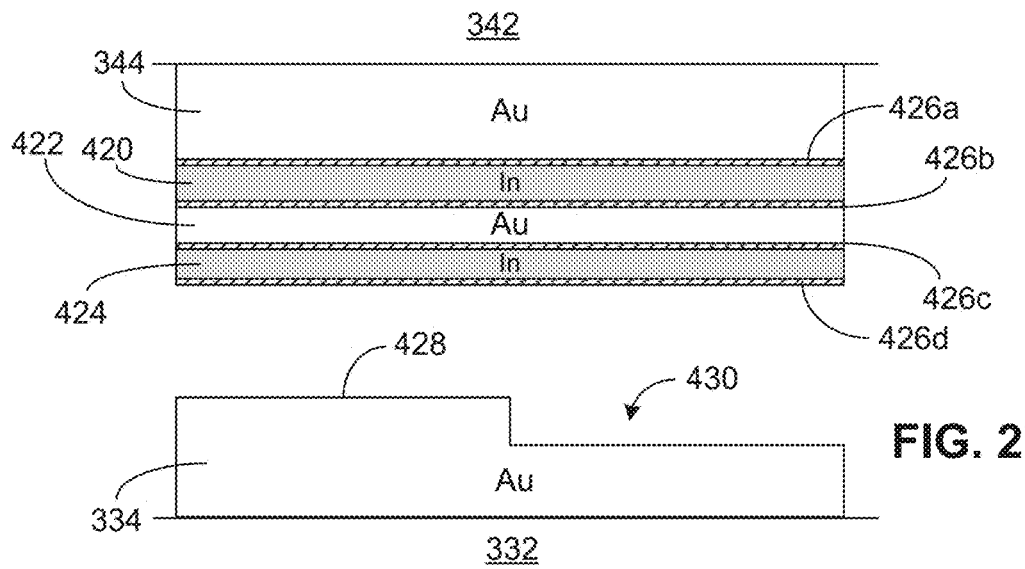
FIG. 27A illustrates a first portion of an embodiment of a method of bonding a first assembly to a second assembly.
Figure 27B:
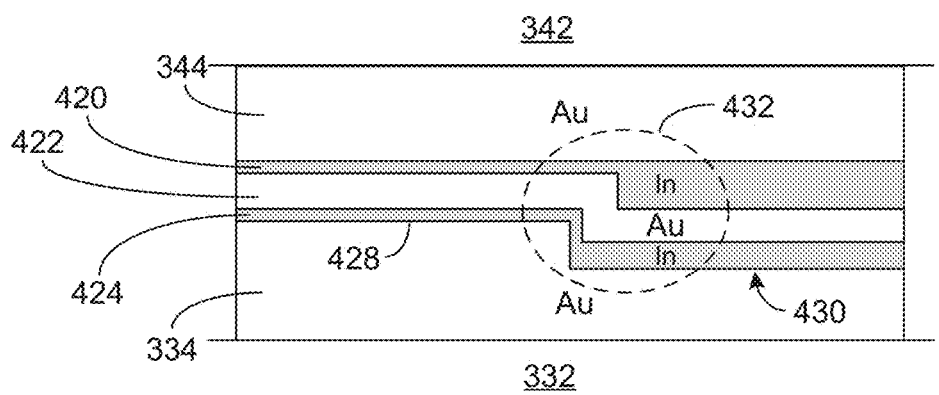
FIG. 27B illustrates a second portion of an embodiment of a method of bonding a first assembly to a second assembly.
Figure 27C:
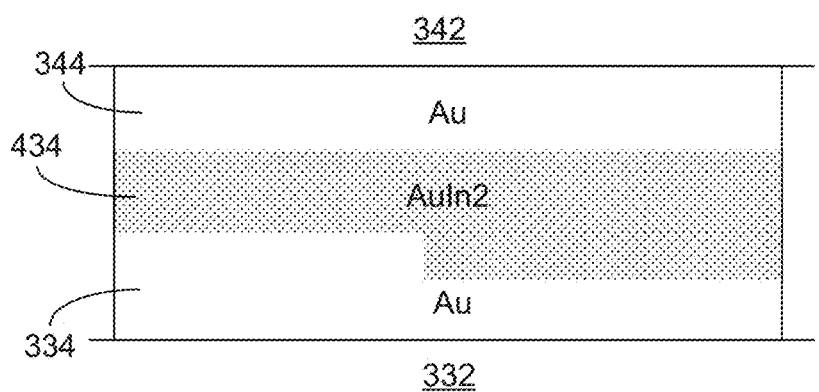
FIG. 27C illustrates a third portion of an embodiment of a method of bonding a first assembly to a second assembly.

FIGS. 27A-27C illustrate how a bonding structure including multiple layers of high melting temperature material 344, 422 and multiple layers of lower meting temperature bonding material 420, 424, as well as optional barrier layers 426*a*, 426*b*, 426*c*, 426*d*, may form a conformal bond between a second substrate 342 and an upper surface 428 of a material layer, for example, first gold layer 334 disposed on first substrate 332, having an irregularity in the form of a step 430 on its upper surface 428.

FIG. 27A illustrates a second gold layer 344 disposed on a second substrate 342 and on which is disposed a bonding structure having multiple layers of high melting temperature material 344, 422, multiple layers of lower meting temperature bonding material 420, 424, and barrier layers 426*a*, 426*b*, 426*c*, 426*d* disposed at the interfaces between the layers of high melting temperature material 344, 422, and the layers of lower meting temperature bonding material 420, 424. This structure is similar to that illustrated in FIG. 26A, except the lower high melting temperature material layer (gold layer 416) is omitted.

As illustrated in FIG. 27B, as the bonding structure is brought into contact with the first gold layer 334 and heated, the layer of high melting temperature material 422 deforms and the molten low melting temperature bonding material flows to conformally bond the second gold layer 344 to the stepped surface of the first gold layer 334 on both surfaces 428 and 430, for example, in region 432. As illustrated in FIG. 27C, the bonding structure is maintained at a temperature and time suitable to form an alloyed bonding layer 434 conformally bonded to the first gold layer 334 and the second gold layer 344, bonding together these layers and any substrates, devices, or components on which the gold layers 334, 344 are deposited.

In FIGS. 26A and 27C bonding structures including pairs of layers of bonding material are illustrated. It is to be understood that in other embodiments, more than two layers of boning material, for example, layers of indium, separated by layers of higher melting temperature material, for example, layers of gold, and optionally layers of barrier material provided between the bonding material and higher melting point material layers may be provided. For example, in some embodiments three or more layers of bonding material and associated layers of higher melting temperature material and barrier layers may be provided.

It should be understood that although the structures and methods described with reference to FIGS. 19-27C were described as used to bond one substrate to another, these bonding structures and methods are equally applicable to bonding a device or component to a substrate or another device or component of an electronic system and/or to components of a package for an electronic device or system.

In some embodiments, the relative amounts of high temperature melting point material and lower melting point bonding material in the various material layers in the structures and methods described with reference to FIGS. 19-27C may be selected such that a final alloyed bonding layer is formed that includes the same relative amounts of high temperature melting point material and lower melting point bonding material in the disclosed bonding structures and has a melting point between that of the lower melting point bonding material and the higher melting point material. For example, in the embodiment shown in FIGS. 26A-26C, the ratio of the total amount of indium in layers 410 and 414 to the total amount of gold in layers 412 and 416 may be selected such that the alloyed bonding layer 418 has a melting temperature between that of indium and gold. In some embodiments, the amount of gold in the gold layers 412, 416 may be selected to be less than that which would provide a desired ratio of gold to indium in the final alloyed layer 418 to account for additional gold that would diffuse into the alloyed bonding layer from one or both of the first gold layer 334 and the second gold layer 344 and provide the desired ratio of indium to gold in the alloyed bonding layer 418.

A method, generally indicated at 500 for forming a bonding structure as disclosed herein is illustrated in FIG. 28. In act 502 a substrate is provided. The substrate may include, in various embodiments, a mounting substrate, for example, a printed circuit board or a component of a package for an electronic device or may include a surface of an electronic device or component. In act 504 a first binary component layer is formed on the substrate. The first binary component may be a material with a higher melting temperature than a second binary component that will be subsequently deposited. The first binary component layer may be a layer of gold, for example, layer 344 illustrated in FIGS. 26A and 27A. Formation of the first binary component layer, as well as the other material layers included in the various structures and methods disclosed herein may be accomplished by physical vapor deposition (sputtering or evaporative deposition), chemical vapor deposition, electroplating, screen printing, or any other method of material deposition known in the art.

In act 506 a barrier layer is formed on the first binary component layer. The barrier layer may include, for example, titanium, platinum, nickel, indium oxide, tin, or combinations thereof. The barrier layer may be, for example, barrier layer 418a illustrated in FIG. 26A or barrier layer 426a illustrated in FIG. 27A.

In act 508 a second binary component layer is formed on the barrier layer deposited in act 506. The second binary component layer includes or consists of a material with a lower melting temperature than the material of the first binary component layer. For example, if the first binary component layer is formed from gold, the second binary component layer may be formed from indium. The second binary component layer may be, for example, layer 410 illustrated in FIG. 26A or layer 420 illustrated in FIG. 27A.

In act 510 a second barrier layer is formed on the second binary component layer deposited in act 508. The second barrier layer may be similar or the same in terms of material and/or thickness as the barrier layer deposited in act 506. The second barrier layer may be, for example, barrier layer 418b illustrated in FIG. 26A or barrier layer 426b illustrated in FIG. 27A.

In act 512 another (a second) first binary component layer is formed on the second barrier layer. The another first binary component layer may be similar or the same in terms of material and/or thickness as the first binary component layer deposited in act 504. The another first binary component layer may be, for example layer 412 illustrated in FIG. 26A or layer 422 illustrated in FIG. 27A.

In act 514, a third barrier layer is formed on the another first binary component layer. The third barrier layer may be similar or the same in terms of material and/or thickness as the barrier layer deposited in act 506. The third barrier layer may be, for example, barrier layer 418c illustrated in FIG. 26A or barrier layer 426c illustrated in FIG. 27A.

In act 516, another (a second) second binary component layer is formed on the barrier layer deposited in act 514. The another second binary component layer may be similar or the same in terms of material and/or thickness as the second binary component layer deposited in act 508. The another second binary component layer may be, for example, layer 414 illustrated in FIG. 26A or layer 424 illustrated in FIG. 27A.

In act 518, a fourth barrier layer is formed on the another second binary component layer. The fourth barrier layer may be similar or the same in terms of material and/or thickness as the barrier layer deposited in act 506. The fourth barrier layer may be, for example, barrier layer 418d illustrated in FIG. 26A or barrier layer 426d illustrated in FIG. 27A.

FIG. 29 illustrates a flowchart of another method, indicated generally at 520, of forming a bonding structure. Acts 522, 524, 526, 528, 530, 532, 534, 536, and 538 of the method of FIG. 29 correspond to acts 502, 504, 506, 508, 510, 512, 514, 516, and 518, respectively of the method of FIG. 28. The method of FIG. 29 specifically indicates that the material of the first binary component layers is gold and the material of the second binary component layers is indium. The barrier layers of the method of FIG. 29 may be similar or identical in terms of materials and thicknesses as the barrier layers in the method of FIG. 28.

FIGS. 30 and 31 illustrate flowcharts of methods, indicated generally at 540 and 560, respectively of bonding a first assembly to a second assembly. In some embodiments, one or both of the first and second assemblies include a substrate, for example, a semiconductor substrate that may include active devices, a printed circuit board, or a component of a package for an electronic device. In other embodiments, one or both of the first and second assemblies include an electronic device, a device package, and/or other components of an electronic system. The first and second assemblies are not limited to being of any particular type.

In act 542 of method 540 a first assembly having a first binary component layer on a substrate is provided. The first binary component layer is in some embodiments a layer of gold (see act 562 of method 560). In act 544 of method 540 a second assembly having a plurality of binary layers on a substrate is provided. The plurality of binary layers is in some embodiments a structure including a plurality of gold and indium layers (see act 564 of method 560, and the structure illustrated in FIGS. 26A and 27A).

In act 546 of method 540 and act 566 of method 560, the second assembly is positioned against the first assembly. In act 548 of method 540 the first and second assemblies are heated to a temperature that is greater than the melting point of the second binary component but less than the melting point of the first binary component. In some embodiments, the temperature is greater than the melting point of indium but less than the melting point of gold (see act 568 of method 560).

In act 550 of method 540 the temperature of the assemblies is maintained to facilitate inter-diffusion of the first binary component and second binary component to form an alloy from the first binary component and the second binary component. In some embodiments, the alloy is formed from inter-diffusion of gold and indium (see act 570 of method 560).

Figure 32:
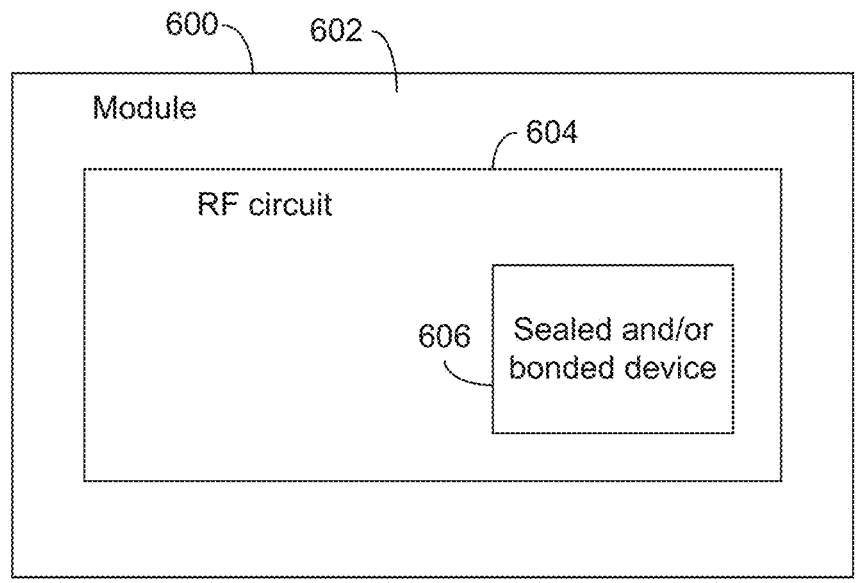
FIG. 32 illustrates an embodiment of an electronics module.

FIG. 32 illustrates an embodiment of an electronic module that may be formed by a method including one or more of the structures and methods disclosed herein. The module 600 includes a substrate 602 on which is formed a radio frequency (RF) circuit 604. The RF circuit may be, for example, a filter or a duplexer. At least one device 606 is sealed or bonded to a portion of the RF circuit utilizing a TLP bonding or sealing method in accordance with methods disclosed herein. In some embodiments, electrical connections are made between contacts on the device 606 and contacts in the RF circuit with a TLP bonding method as disclosed herein, for example, as described with reference to FIGS. 18A and 18B. In other embodiments, the device 606 may be hermetically sealed using a TLP sealing method as disclosed herein, for example, with reference to FIGS. 16A and 16B.

Figure 33:
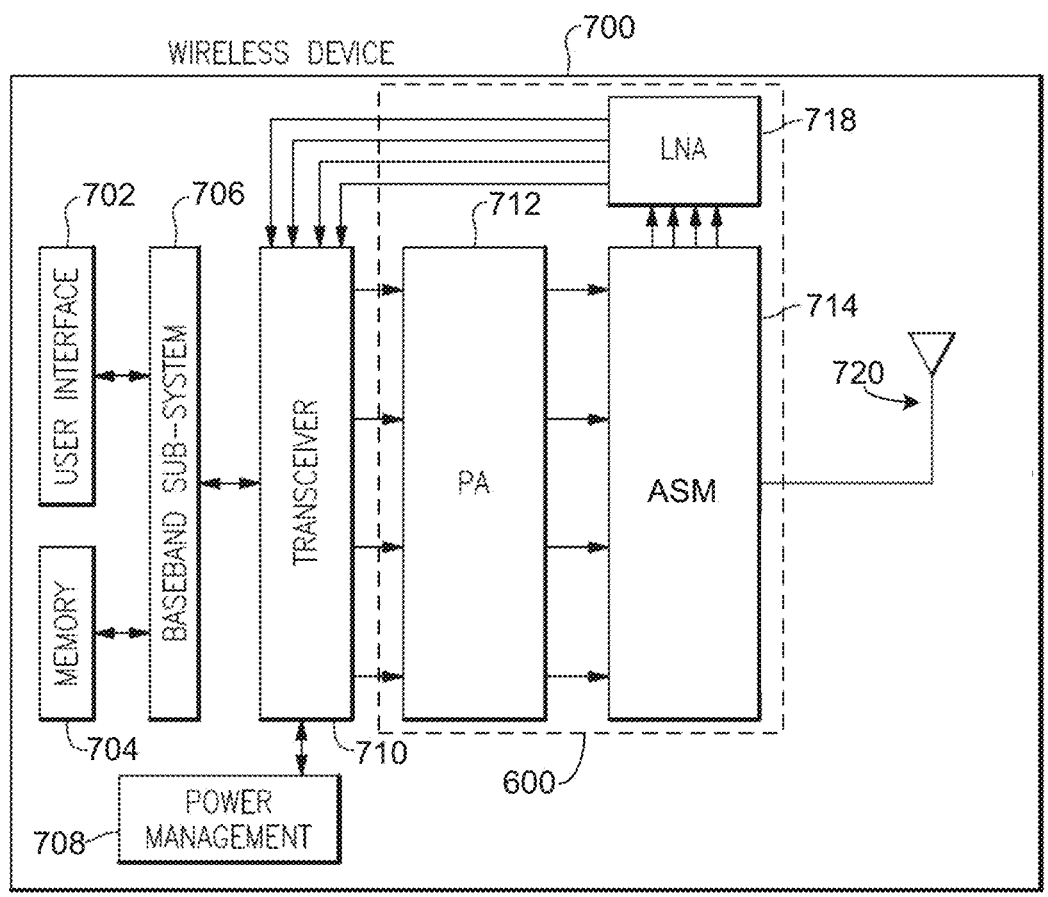
FIG. 33 illustrates an embodiment of a wireless device.

FIG. 33 illustrates an embodiment of wireless device 700 that may be formed by a method including one or more of the structures and methods disclosed herein. The wireless device includes components including a user interface 702, a memory 704, a baseband sub-system 706, a power management sub-system 708, a transceiver 710, a power amplifier 712, an antenna switch module 714, a low noise amplifier 718 and an antenna 720. Any one or more of these components may be bonded to or sealed on a substrate of the wireless device utilizing an embodiment of a TLP bonding or sealing structure and method disclosed herein. In some example, some of the components of the wireless device 700, for example, one or more of the power amplifier 712, antenna switch module 714, and low noise amplifier 718 are included in a module 600 as illustrated in FIG. 32, or alternatively may be the device 606 sealed and/or bonded to the RF circuit 604.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled," as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

Having thus described several aspects of at least one embodiment of this invention, it is to be appreciated various alterations, modifications, and improvements will readily occur to those skilled in the art. Any feature described in any embodiment may be included in or substituted for any feature of any other embodiment. Such alterations, modifications, and improvements are intended to be part of this disclosure, and are intended to be within the scope of the invention. Accordingly, the foregoing description and drawings are by way of example only.

What is claimed is:

1. A bonding structure comprising:
    a first layer of a first alloy component having an upper surface disposed on a substrate;
    a first interfacial barrier layer having an upper surface directly disposed on a lower surface of the first layer of the first alloy component;
    a first layer of a second alloy component having an upper surface disposed directly on a lower surface of the first interfacial barrier layer, the second alloy component having a lower melting temperature than the first alloy component;
    a second interfacial barrier layer having an upper surface directly disposed on a lower surface of the first layer of the second alloy component;
    a second layer of the first alloy component having an upper surface disposed directly on a lower surface of the second interfacial barrier layer;
    a third interfacial barrier layer having an upper surface directly disposed on a lower surface of the second layer of the first alloy component; and
    a second layer of the second alloy component having an upper surface disposed directly on a lower surface of the third interfacial barrier layer.

2. The bonding structure of claim 1 further comprising a third layer of the first alloy component disposed on the second layer of the second alloy component.

3. The bonding structure of claim 1 wherein one of the first interfacial barrier layer, the second interfacial barrier layer, and the third interfacial barrier layer is configured to suppress inter-diffusion of the first alloy component and the second alloy component.

4. The bonding structure of claim 3 wherein the one of the first interfacial barrier layer, the second interfacial barrier layer, and the third interfacial barrier layer includes one or more of titanium, platinum, nickel, indium oxide, and tin.

5. The bonding structure of claim 1 wherein the first alloy component and the second alloy component are selected to inter-diffuse and form an alloy when the bonding structure is heated to a temperature above the melting temperature of the second alloy component and below the melting temperature of the first alloy component.

6. The bonding structure of claim 5 wherein a quantity of the first alloy component and a quantity of the second alloy component in the bonding structure are selected to form an alloy having a melting temperature between the melting temperature of the first alloy component and the melting temperature of the second alloy component.

7. The bonding structure of claim 1 wherein the first alloy component and the second alloy component are a pair of components selected from the pairs of components including gold and indium, aluminum and germanium, gold and silicon, gold and tin, copper and tin, lead and tin, and indium and tin.

8. The bonding structure of claim 1 wherein the first alloy component and the second alloy component are a pair of components selected from the pairs of components including gold and a lead-tin alloy, and germanium and an aluminum-copper alloy.

9. The bonding structure of claim 8 wherein one of the lead-tin alloy and the aluminum-copper alloy has a eutectic composition.

10. The bonding structure of claim 1 further comprising a fourth barrier layer disposed on the second layer of the second alloy component.

11. The bonding structure of claim 10 wherein the fourth barrier layer includes a material that suppresses diffusion of oxygen from the atmosphere into the second layer of the second alloy component.

12. The bonding structure of claim 11 wherein the fourth barrier layer includes a layer of one or more of titanium, platinum, nickel, indium oxide, and tin.

13. The bonding structure of claim 1 wherein the first alloy component and the second alloy component are selected to form a binary alloy when the bonding structure is heated to a temperature above the melting temperature of the second alloy component and below the melting temperature of the first alloy component.

14. The bonding structure of claim 1 wherein the first alloy component and the second alloy component are selected to form a transient liquid phase bond when the bonding structure is heated to a temperature above the melting temperature of the second alloy component and below the melting temperature of the first alloy component.

15. A bonding structure comprising:
- a first layer of a first binary component disposed on a substrate;
- a first barrier layer disposed on the first layer of the first binary component;
- a first layer of a second binary component disposed on the first barrier layer, the first barrier layer including a material that suppresses inter-diffusion of the second binary component in the first layer of the second binary component and the first binary component in the first layer of the first binary component;
- a second barrier layer disposed on the first layer of the second binary component;
- a second layer of the first binary component disposed on the second barrier layer;
- a third barrier layer disposed on the second layer of the first binary component;
- a second layer of the second binary component layer disposed on the third barrier layer; and
- a fourth barrier layer disposed on the second layer of the second binary component, the fourth barrier layer including a material that suppresses diffusion of atmospheric oxygen into the second layer of the second binary component.

16. The bonding structure of claim 15 wherein the second binary component includes a metal having a lower melting temperature than the first binary component.

17. The bonding structure of claim 15 wherein the second binary component is a material that forms an alloy with the first binary component, the alloy having a higher melting temperature than the second binary component.

18. The bonding structure of claim 17 wherein a quantity of the first binary component and a quantity of the second binary component in the bonding structure are selected so that the alloy has a melting temperature between the melting temperature of the first binary component and the melting temperature of the second binary component.

19. The bonding structure of claim 15 wherein the at least one of the first barrier layer, the second barrier layer, and the third barrier layer include a layer of one or more of titanium, platinum, nickel, indium oxide, and tin.

20. The bonding structure of claim 15 wherein the first binary component and the second binary component are a pair of components selected from the pairs of components including gold and indium, aluminum and germanium, gold and silicon, gold and tin, copper and tin, lead and tin, and indium and tin.

21. The bonding structure of claim 15 wherein the substrate is one of a semiconductor substrate including one or more active devices, a printed circuit board, or a component of a package for an electronic device.

* * * * *